(12) United States Patent
Miller

(10) Patent No.: US 7,928,750 B2
(45) Date of Patent: Apr. 19, 2011

(54) CONTACTLESS INTERFACING OF TEST SIGNALS WITH A DEVICE UNDER TEST

(75) Inventor: Charles A. Miller, Fremont, CA (US)

(73) Assignee: FormFactor, Inc., Livermore, CA (US)

( * ) Notice: Subject to any disclaimer, the term of this patent is extended or adjusted under 35 U.S.C. 154(b) by 0 days.

(21) Appl. No.: 12/336,111

(22) Filed: Dec. 16, 2008

(65) Prior Publication Data

US 2009/0102494 A1    Apr. 23, 2009

Related U.S. Application Data

(62) Division of application No. 10/772,970, filed on Feb. 5, 2004, now Pat. No. 7,466,157.

(51) Int. Cl.
*G01R 31/28* (2006.01)
*G01R 31/303* (2006.01)

(52) U.S. Cl. ........... 324/754.21; 324/750.3; 324/756.05; 324/762.01; 714/733; 714/734; 257/48

(58) Field of Classification Search .......... 324/754–765; 714/733–734; 257/48
See application file for complete search history.

(56) References Cited

U.S. PATENT DOCUMENTS

| | | |
|---|---|---|
| 3,619,504 A | 11/1971 | De Veer |
| 4,901,041 A | 2/1990 | Pengelly |
| 5,023,993 A | 6/1991 | Fengelly |
| 5,130,644 A | 7/1992 | Ott |
| 5,138,436 A | 8/1992 | Koepf |
| 5,216,361 A | 6/1993 | Akar et al. |
| 5,237,663 A | 8/1993 | Srinivasan |
| 5,251,235 A | 10/1993 | Henoch |
| 5,311,122 A | 5/1994 | Fullerton et al. |
| 5,365,205 A | 11/1994 | Wong |
| 5,389,870 A | 2/1995 | Burrage |
| 5,389,890 A | 2/1995 | Burrage |
| 5,396,650 A | 3/1995 | Terauchi |
| 5,420,796 A | 5/1995 | Weling et al. |
| 5,432,486 A | 7/1995 | Wong |
| 5,452,291 A | 9/1995 | Eisenhandler et al. |
| 5,517,110 A * | 5/1996 | Soiferman ................. 324/158.1 |
| 5,528,203 A | 6/1996 | Mohwinkel et al. |
| 5,539,325 A | 7/1996 | Rostoker et al. |

(Continued)

FOREIGN PATENT DOCUMENTS

JP    48-035845    10/1973

(Continued)

OTHER PUBLICATIONS

Chang et al., "RF/Wireless Interconnect for Inter- and Intra-Chip Communications," Proceedings of the IEEE, vol. 89 No. 4 (Apr. 2001), pp. 456-466.

*Primary Examiner* — Ha Tran T Nguyen
*Assistant Examiner* — Emily Y Chan
(74) *Attorney, Agent, or Firm* — Kirton & McConkie

(57) ABSTRACT

An interface device receives test data from a tester. A signal representing the test data is transmitted to a device under test through electromagnetically coupled structures on the interface device and the device under test. The device under test processes the test data and generates response data. A signal representing the response data is transmitted to the interface device through electromagnetically coupled structures on the device under test and the interface device.

14 Claims, 13 Drawing Sheets

U.S. PATENT DOCUMENTS

| | | |
|---|---|---|
| 5,592,480 A | 1/1997 | Carney et al. |
| 5,608,606 A | 3/1997 | Blaney |
| 5,638,402 A | 6/1997 | Osaka et al. |
| 5,714,888 A * | 2/1998 | Naujoks .................. 324/750 |
| 5,717,725 A | 2/1998 | Campana, Jr. |
| 5,719,860 A | 2/1998 | Maison et al. |
| 5,739,665 A | 4/1998 | Bares |
| 5,751,820 A | 5/1998 | Tainzer |
| 5,771,462 A | 6/1998 | Olsen |
| 5,793,359 A | 8/1998 | Ushikubo |
| 5,815,732 A | 9/1998 | Cooper et al. |
| 5,825,193 A | 10/1998 | Nakata et al. |
| 5,838,163 A | 11/1998 | Rostoker et al. |
| 5,853,020 A | 12/1998 | Widner |
| 5,867,688 A | 2/1999 | Simmon et al. |
| 5,890,015 A | 3/1999 | Garney et al. |
| 5,894,425 A | 4/1999 | Saliba |
| 5,894,474 A | 4/1999 | Maison et al. |
| 5,913,174 A | 6/1999 | Casarez et al. |
| 5,917,388 A | 6/1999 | Tronche et al. |
| 5,930,725 A | 7/1999 | Kornby |
| 5,940,384 A | 8/1999 | Carney et al. |
| 5,983,100 A | 11/1999 | Johansson et al. |
| 6,003,072 A | 12/1999 | Gerritsen et al. |
| 6,011,785 A | 1/2000 | Carney et al. |
| 6,111,476 A | 8/2000 | Williamson |
| 6,137,303 A | 10/2000 | Deckert et al. |
| 6,139,364 A | 10/2000 | Beutler et al. |
| 6,215,454 B1 | 4/2001 | Tran |
| 6,236,223 B1 * | 5/2001 | Brady et al. .................. 324/765 |
| 6,246,251 B1 | 6/2001 | Gallagher |
| 6,331,782 B1 * | 12/2001 | White et al. .................. 324/763 |
| 6,356,173 B1 | 3/2002 | Nagata et al. |
| 6,449,308 B1 | 9/2002 | Knight, Jr. et al. |
| 6,559,531 B1 | 5/2003 | Sutherland |
| 6,600,325 B2 | 7/2003 | Coates et al. |
| 6,759,863 B2 * | 7/2004 | Moore .......................... 324/765 |
| 6,759,864 B2 | 7/2004 | Moore |
| 6,882,239 B2 | 4/2005 | Miller |
| 6,885,202 B2 | 4/2005 | Slupsky |
| 7,057,518 B2 | 6/2006 | Schmidt |
| 7,067,909 B2 | 6/2006 | Reif et al. |
| 7,109,730 B2 * | 9/2006 | Slupsky ........................ 324/753 |
| 7,202,687 B2 | 4/2007 | Khandros et al. |
| 7,215,133 B2 | 5/2007 | Kwark |
| 7,466,157 B2 | 12/2008 | Miller |
| 7,612,630 B2 | 11/2009 | Miller |
| 2002/0057137 A1 | 5/2002 | Marketkar et al. |
| 2005/0086021 A1 | 4/2005 | Khandros et al. |
| 2005/0138499 A1 | 6/2005 | Pileggi et al. |
| 2005/0156755 A1 | 7/2005 | Miller |
| 2005/0174131 A1 | 8/2005 | Miller |
| 2007/0182438 A1 | 8/2007 | Khandros et al. |

FOREIGN PATENT DOCUMENTS

| | | |
|---|---|---|
| JP | 07-141079 | 6/1995 |
| JP | 08-064643 | 3/1996 |
| JP | 08-236696 | 9/1996 |
| JP | 09-298409 | 11/1997 |
| JP | 2001-102819 | 1/2000 |
| JP | 2001-060824 | 3/2001 |
| JP | 2003-057308 | 2/2003 |
| WO | WO 90/06518 * | 6/1990 |
| WO | WO 99/32893 | 7/1999 |
| WO | WO 00/01013 | 1/2000 |

* cited by examiner

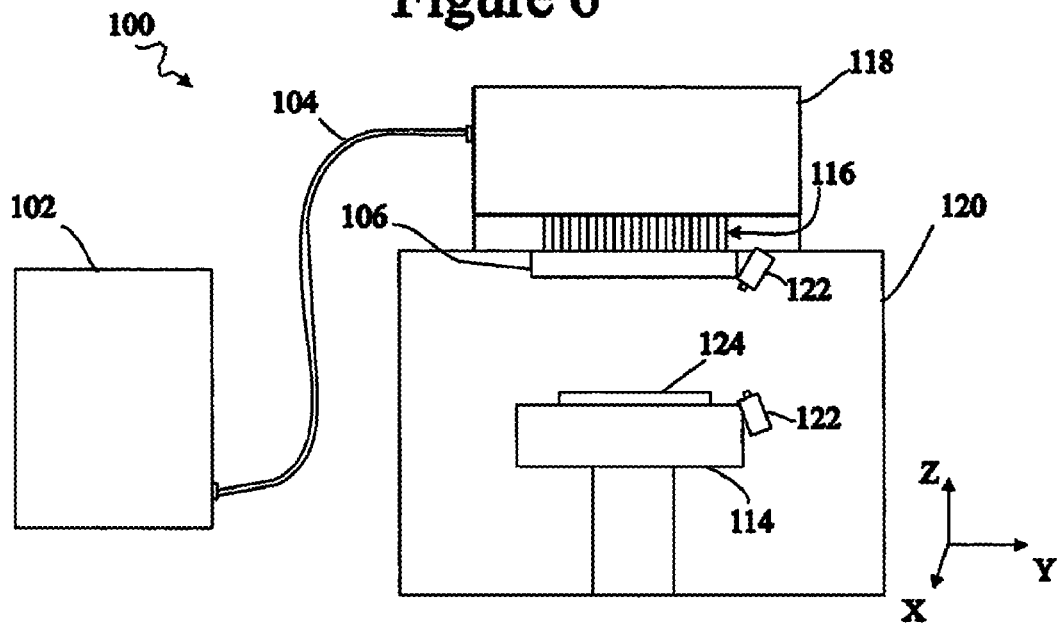
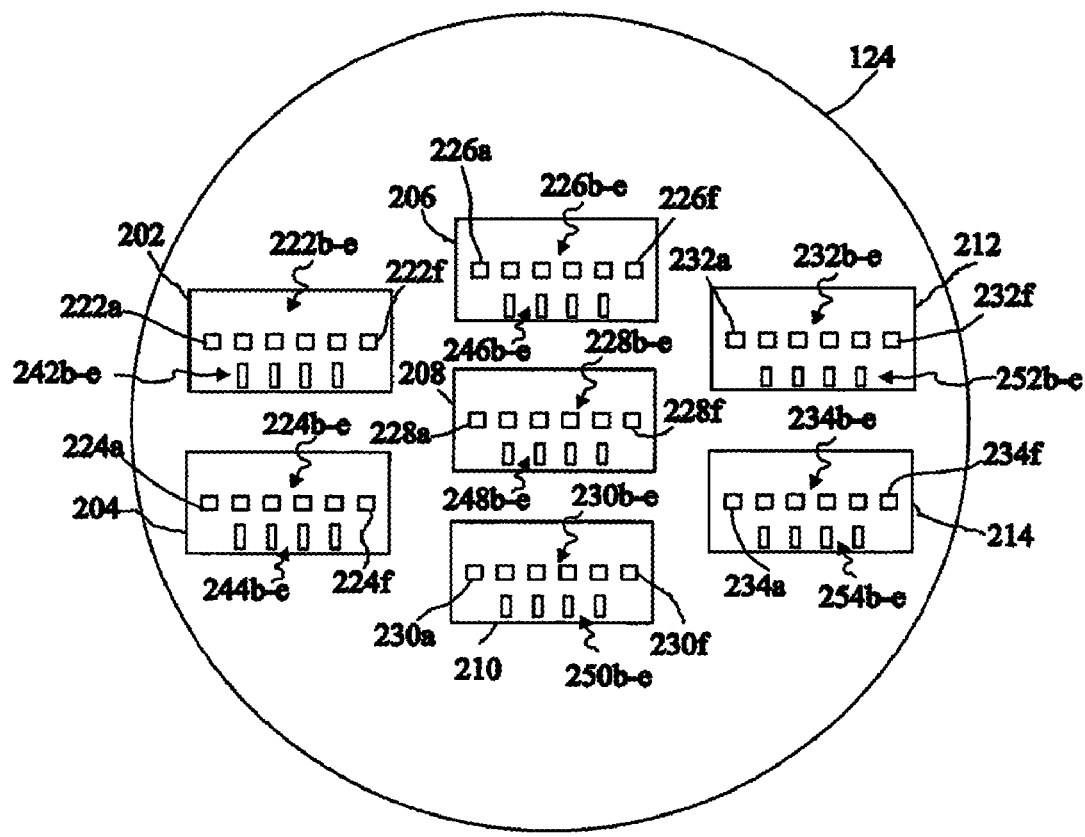

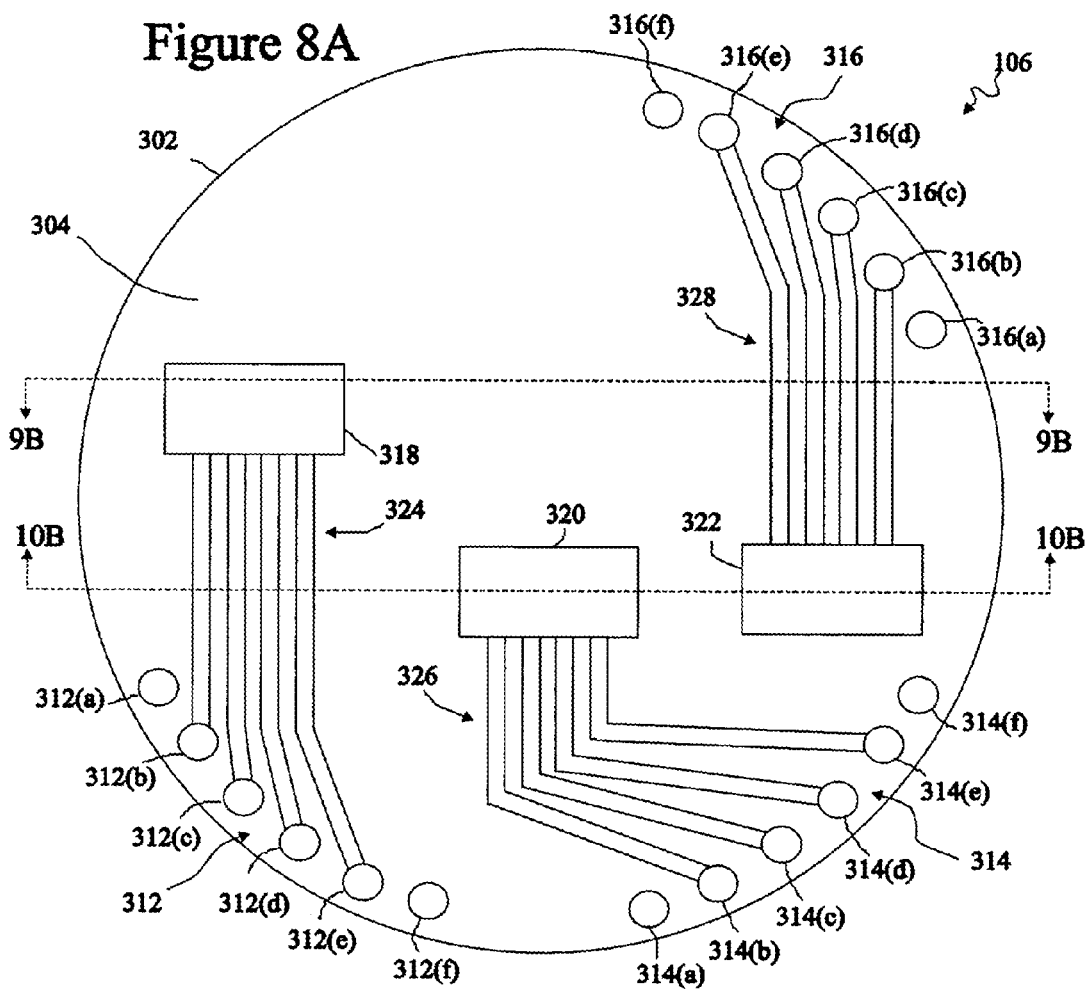
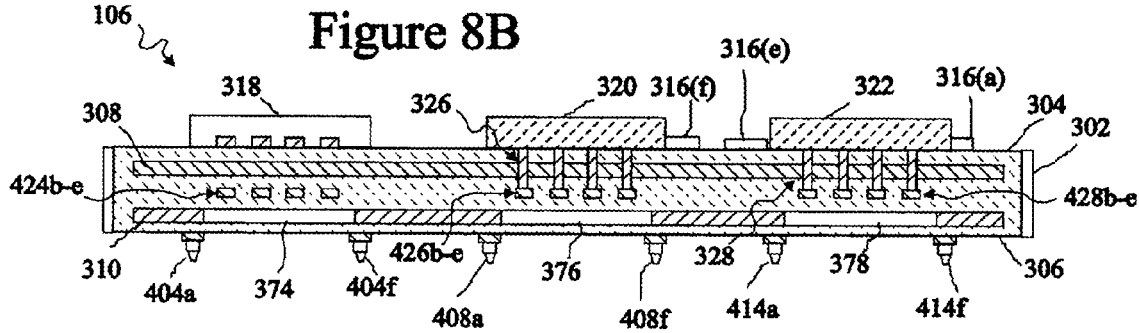

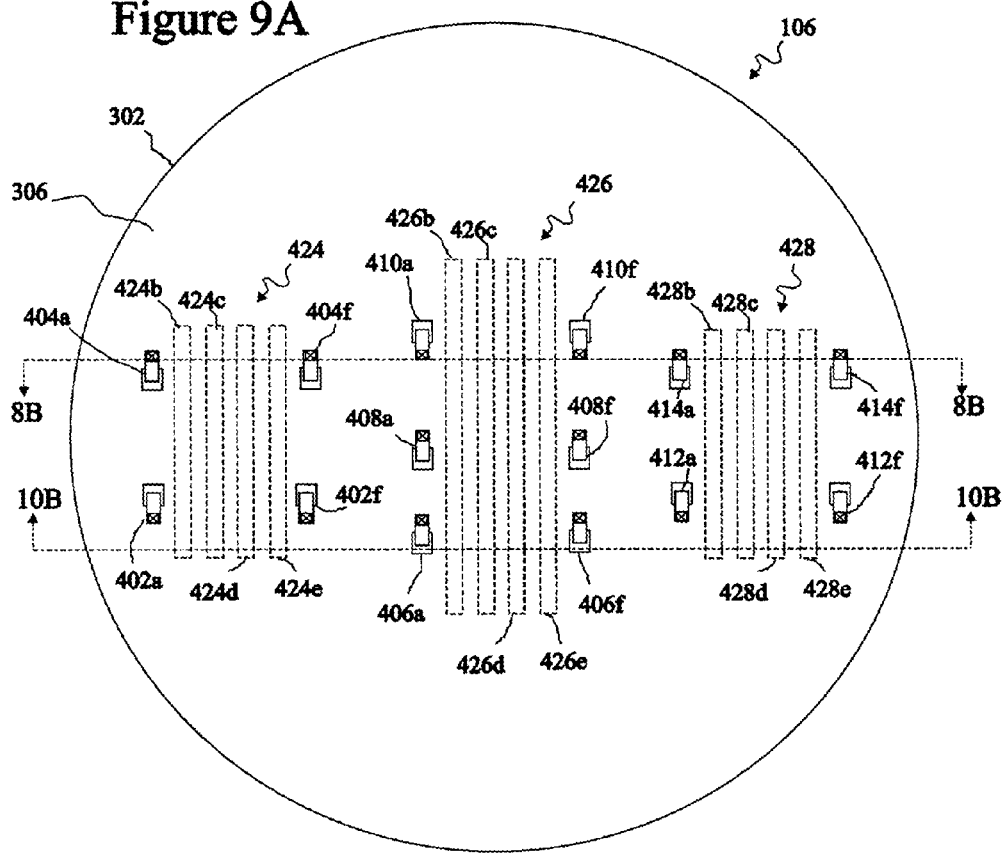
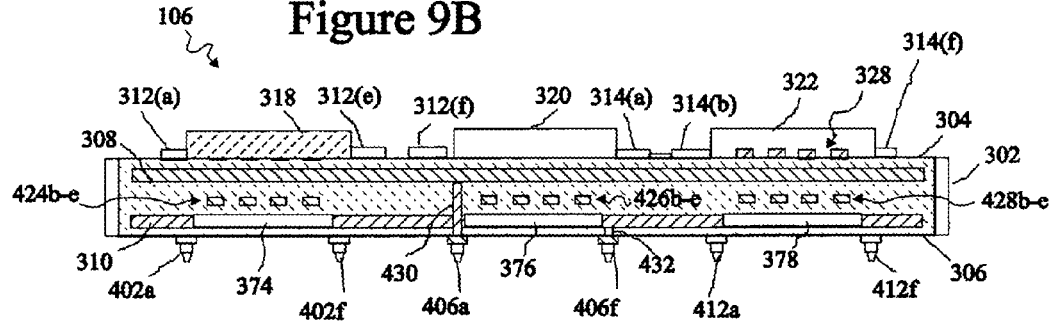

CONTACTLESS INTERFACING OF TEST SIGNALS WITH A DEVICE UNDER TEST

BACKGROUND

Although this invention is generally applicable to test systems and methods in general, it is particularly suited for semiconductor device testing.

As is known, semiconductor devices are typically manufactured many at a time as "dies" on a semiconductor wafer, after which the dies are further processed before being shipped to customers or installed in various products. That further processing may take many forms.

In perhaps the most common post-manufacture processing, the dies are probed and tested while still in wafer form. Thereafter, the dies are singulated from the wafer, and the dies that passed the initial probe testing are packaged, burned in, and further tested. In another common process, the dies are not packaged after being singulated from the wafer but are further tested and often burned in to produce "known good dies," which are unpackaged dies that have been fully tested. In more advanced processes, the dies are burned in and fully tested while in wafer form.

In all of these exemplary post-manufacture processes, as well as other scenarios in which electronic devices of any kind are tested, there is a need to control testing and/or exercising of the dies or other electronic devices.

BRIEF SUMMARY

The present invention relates generally to contactlessly interfacing at least one test signal to and/or from an electronic device under test. In an exemplary embodiment of the invention, a test signal received from a tester is transmitted to the device under test by contactless electromagnetic coupling. Similarly, response data generated by the device is transmitted from the device by contactless electromagnetic coupling.

BRIEF DESCRIPTION OF THE SEVERAL VIEWS OF THE DRAWINGS

FIG. 6 illustrates an exemplary test system for testing semiconductor wafers.

FIG. 7 illustrates an exemplary wafer with electromagnetic coupling pads.

FIG. 8A illustrates a top view of an exemplary probe card.

FIG. 8B illustrates a cross-sectional side view of the probe card of FIG. 8A.

FIG. 9A illustrates a bottom view of the probe card of FIG. 8A.

FIG. 9B illustrates another cross-sectional side view of the probe card of FIG. 8A.

DETAILED DESCRIPTION OF EXEMPLARY EMBODIMENTS

Figure 1:
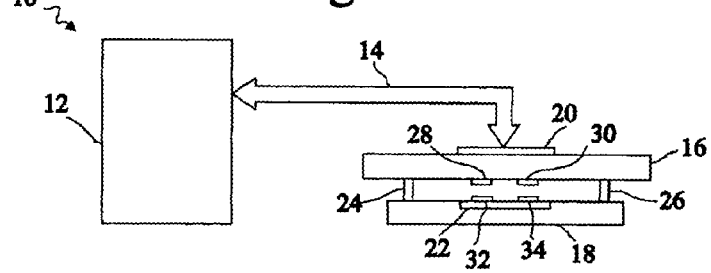
FIG. 1 illustrates an exemplary test system that utilizes contactless communications.

The present invention relates generally to contactlessly interfacing at least one test signal to or from an electronic device under test. This specification describes exemplary embodiments and applications of the invention. The invention, however, is not limited to these exemplary embodiments and applications or to the manner in which the exemplary embodiments and applications operate or are described herein.

FIGS. 1-5 illustrate an exemplary embodiment of a test system 10 in which test data and response data are contactlessly communicated between a test board 16 and an electronic device being tested 18. Test system 10 includes a tester 12 that generates test data for testing electronic device 18. (Hereinafter, an electronic device being tested will be referred to as a device under test or a DUT.) DUT 18 may be any type of electronic device, including without limitation a semiconductor die (singulated or unsingulated from a wafer, packaged or unpackaged), an electronic system comprising a plurality of electronic components, etc. Test data for testing DUT 18 and power and ground for powering DUT 18 during testing are provided through communications link 14 (e.g., a cable, a twisted pair, an optical link, a wireless link, etc.) to interface board 16. As just one example, communications link 14 may be wireless as described in U.S. patent application Ser. No. 10/690,170, filed Oct. 21, 2003 and entitled "Wireless Test System," by Khandros et al., which is incorporated in its entirety herein by reference. Power probe 26 and ground probe 24 provide power and ground, respectively, from the interface board 16 to DUT 18. The test data is contactlessly communicated from interface board 16 through coupling traces 28 and 30 to coupling pads 32 and 34 on DUT 18. Response data generated by the DUT 18 in response to the test data is similarly communicated contactlessly from DUT 18 through coupling pads 32 and 34 to coupling traces 28 and 30, after which the response data is returned to the tester 12 via communications link 14. Board communications control circuitry 20 on interface board 16 and DUT communications control circuitry 22 on DUT 18 control contactless data communications between interface board 16 and DUT 18. (Probes 24 and 26 may be any type of probes, including without limitation needle probes, buckling beam probes, bumps, posts, or spring probes. Nonexclusive examples of spring probes include the spring contacts described in U.S. Pat. Nos. 5,917,707, 6,255,126, 6,475,822, and 6,491,968; and U.S. Patent Application Publication No. 2001/0044225 A1 and U.S. Patent Application Publication No. 2001/0012739 A1. The foregoing patents and patent applications are incorporated herein by reference in their entirety.)

Coupling trace 28 is disposed in sufficient proximity to coupling pad 32 to electromagnetically couple with coupling pad 32. Thus, a signal driven onto coupling trace 28 generates a similar but typically attenuated signal in coupling pad 32. The reverse is also true: a signal driven onto coupling pad 32 generates a similar signal in coupling trace 28. Coupling trace 30 is similarly disposed in sufficient proximity to coupling pad 34 to electromagnetically couple with coupling pad 34. Thus, a signal driven onto coupling trace 30 generates a similar signal in coupling pad 34, and a signal driven onto coupling pad 34 generates a similar signal in coupling trace 30. There is thus provided contactless communications of data signals between interface board 16 and DUT 18.

Figure 2A:
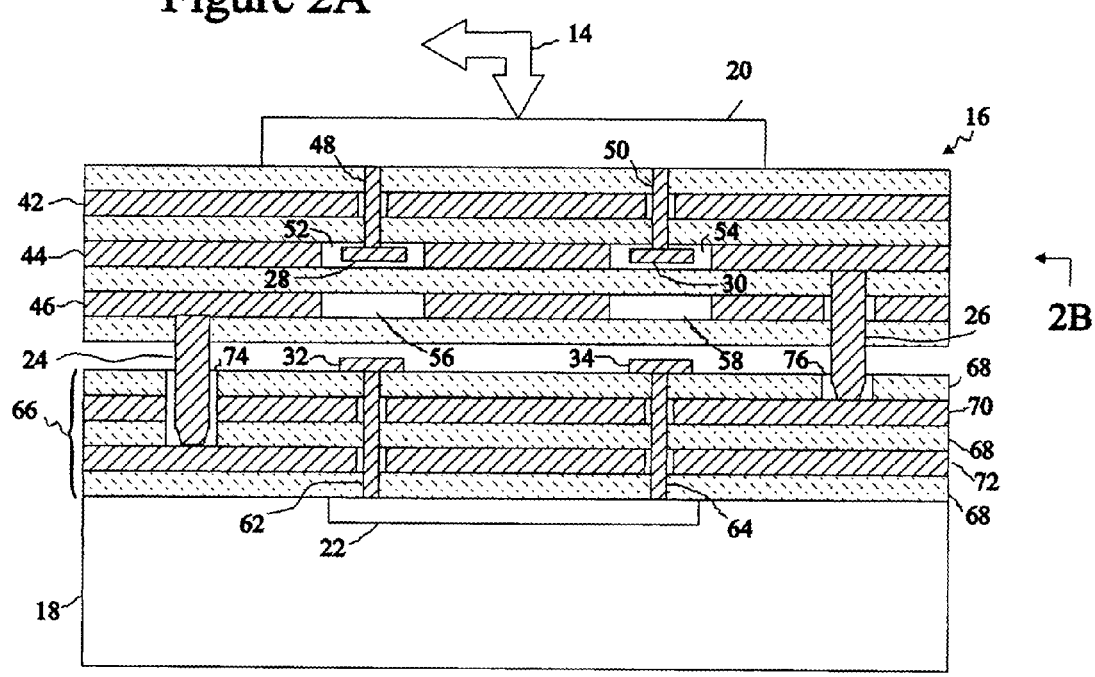
FIGS. 2A and 2B illustrate cross sectional, side views of an interface board and device under test with shielding/power planes.
Figure 2B:
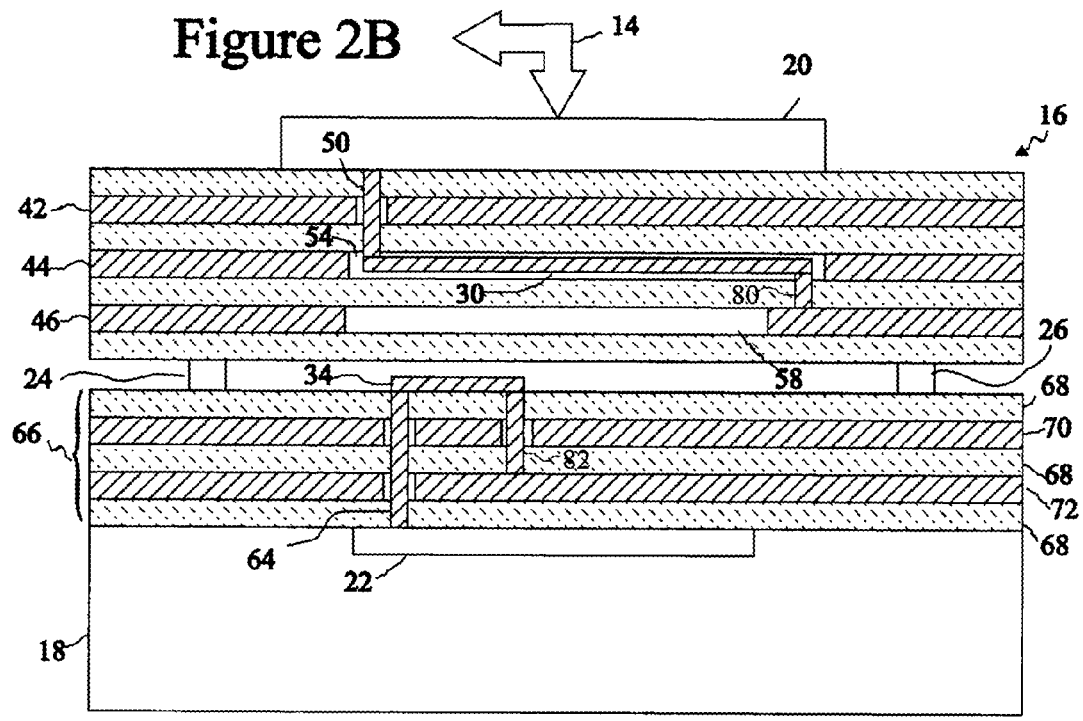

FIG. 2A illustrates a cross-sectional side view of interface board 16 in which coupling traces 28 and 30 are embedded within board 16, and FIG. 2A also illustrates a cross-sectional side view of DUT 18 with power and ground planes embedded in a dielectric material disposed on DUT 18. FIG. 2B also shows cross-sectional side view of interface board 16 and DUT 18 but viewed from a different side (as shown in FIG. 2A) than FIG. 2A.

As shown in FIGS. 2A and 2B, three conductive planes 42, 44, and 46 are embedded in interface board 16, which may comprise a nonconductive substrate, such as a printed circuit board or a ceramic substrate. Shielding plane 42 shields traces 28 and 30 (which are connected to board communications control circuitry 20 by vias 48 and 50) from electrical interference from board communications control circuitry 20, other electronic devices, or other sources of electrical interference. Conductive shielding plane 42 may optionally be grounded or connected to a voltage source. Power plane 44 provides power through probe 26 to DUT 18, and power plane includes openings 52 and 54 for coupling traces 28 and 30, respectively, shielding traces 28 and 30 from each other. Power plane 44 is powered by a connection (not shown) to a power source, such as power from the tester through communications link 14. Ground plane 46 provides ground through probe 24 to DUT 18 and also shields traces 28 and 30 from electrical interference. Windows 56 and 58 in ground plane 46 allow traces 28 and 30 to electromagnetically couple with coupling pads 32 and 34. It should be apparent that providing shielding for coupling traces 28 and 30 is optional. Moreover, the number, arrangement, and type of planes or other conductive structures used to shield traces 28 and 30 may vary.

As also shown in FIGS. 2A and 2B, temporary (or permanent) shielding and power distribution structure 66 may be disposed on the DUT 18. The exemplary shielding and power distribution structure 66 shown in FIGS. 2A and 2B includes a power plane 70 and a ground plane 72 embedded between layers of a dielectric or insulating material 68. The power plane 70 may be powered by a probe 26 from interface board 16, and ground plane 72 may similarly be grounded by a probe 24 from interface board 16. Power plane 70 provides power to DUT 18, and ground plane 72 provides ground connections to DUT 18. Power and ground planes 70 and 72 may also shield DUT 18 from electrical interference. Coupling pads 32 and 34 are electrically connected to DUT communications control circuitry 22 on DUT by vias 62 and 64. Note that power plane 70 and ground plane 72 may optionally also function as a decoupling capacitor.

As shown in FIG. 2B, coupling trace 30 is connected at one end to board communications control circuitry 20 by via 50. More specifically, a transceiver in board communications control circuitry 20 is connected to the one end of coupling trace 30. The other end of trace 30 is connected to ground plane 46 by via 80. Alternatively, the other end of trace 30 may be left open (that is, not connected to ground or any voltage level), or the other end of trace 30 may be connected to a voltage source. Because trace 30 functions in part like a transmission line, it may be advantage to terminate trace 30 with a resistance (not shown) that is approximately equal to the characteristic impedance of trace 30, whether or not trace is also connected at its termination end to ground. Trace 28 may be similar to trace 30.

FIG. 2B also illustrates an exemplary loop structure for coupling pad 34 in which coupling pad 34 is connected at one end to DUT communications control circuitry 22 on DUT 18 (more specifically, a transceiver in DUT 18 communications control circuitry 22 is connected to the one end of coupling pad 34), and coupling pad 34 is connected at its other end to ground plane 72. Again, however, the other end of coupling pad 34 may be left open (for example by not including via 82), may be connected to a voltage source, and/or may be terminated with the characteristic impedance of the coupling pad 34. Coupling pad 32 may be similar to coupling pad 34.

Figure 3:
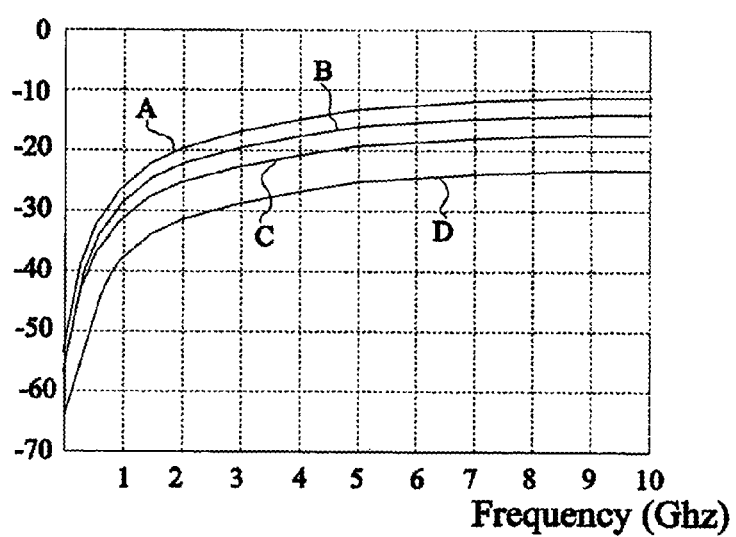
FIG. 3 shows exemplary coupling characteristics.

FIG. 3 shows plots of attenuation in the level of the signal generated in a coupling pad 34 by a signal driven onto coupling trace 30. The plots show attenuation (in decibels) of the level of the signal generated in coupling pad 34 compared to the original signal driven onto trace 30 verses frequency (in gigahertz) of the original signal driven onto trace 30. For each of the four plots A, B, C, and D shown in FIG. 3, the following exemplary dimensions in FIGS. 2A and 2B are assumed: the distance between shielding plane 42 and power plane 44 is about 150 microns; the distance between power plane 44 and ground plane 46 is about 150 microns; the thickness of the power and shielding structure 66 on DUT 18 is about 25 microns; the width of trace 30 is about 150 microns; the distance between coupling structures 32 and 34 (as viewed in FIG. 2A) is about 500 microns; the length of trace 30 (as viewed in FIG. 2B) is about 3000 microns; and the length of coupling pad 34 (as viewed in FIG. 2B) is about 2500 microns. In addition, trace 30 is assumed to have a characteristic impedance of about 50 ohms and to be terminated at both ends with 50 ohms of resistance. Coupling pad 34 is also assumed to have a characteristic impedance of about 50 ohms and to be grounded at one end and terminated with a 50 ohm resistor at the other end. Plot A corresponds to a spacing between trace 30 and coupling pad 34 of about 50 microns; plot B corresponds to a spacing between trace 30 and coupling pad 34 of about 100 microns; plot C corresponds to a spacing between trace 30 and coupling pad 34 of about 200 microns; and plot D corresponds to a spacing between trace 30 and coupling pad 34 of about 400 microns.

It must be stressed that the above dimensions are exemplary only and given as a framework for the sample data presented in FIG. 3. The invention is not limited in any way to the above described dimensions or the sample data presented in FIG. 3. Further discussion of exemplary methods of implementing communications through electromagnetic coupling are discussed in US Patent Application Publication 2002/0186,106, which is incorporated by reference herein in its entirety.

Figure 4:
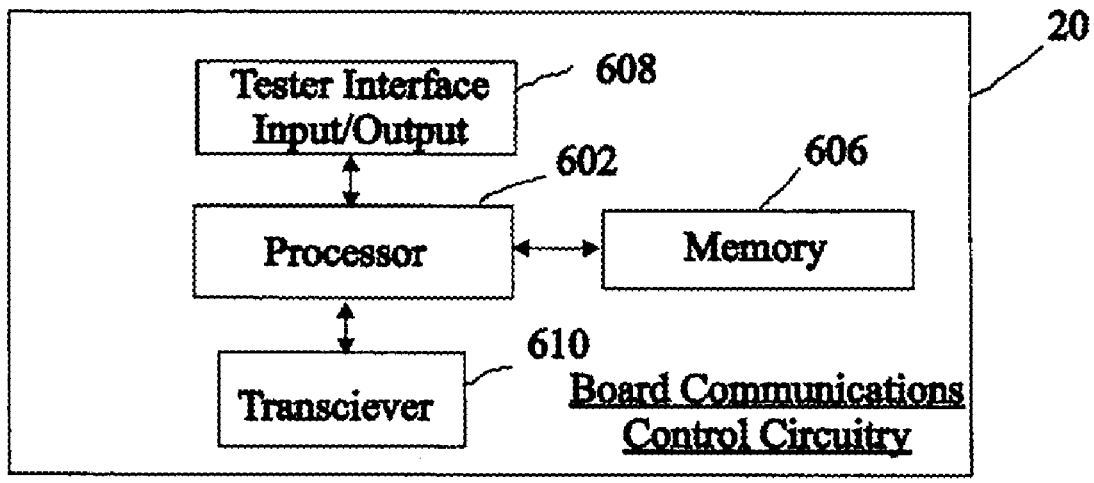
FIG. 4 illustrates exemplary board communications control circuitry.

FIG. 4 illustrates a simplified block diagram of an exemplary embodiment of board communications control circuitry 20 on interface board 16. As shown, board communications control circuitry 20 includes a processor 602, memory 606, tester interface input/output circuitry 608, and transceiver circuitry 610. Processor 602, which may be any type of microprocessor or microcontroller, controls overall operation of the board communications control circuitry 20. Processor 602 preferably operates under control of software stored in memory 606. Alternatively, processor may comprise hardwired logic circuits or a combination of software control and hardwired logic circuits. In addition to storing software to run on processor 602, memory 606 may provide general data storage.

Tester interface input/output circuitry 608 provides input of signals from and output of signals to tester 12. Transceiver circuitry 610 provides for contactless communications of signals to and from DUT 18 via electromagnetic coupling of traces 28 and 30 with coupling pads 32 and 34. That is, transceiver circuitry 610 sends test data received from the tester to DUT 18 by encoding the test data and driving the encoded test data onto one or more of traces 28 and/or 30. Transceiver circuitry 610 preferably encodes the data using any suitable radio-frequency (RF) modulation scheme. Non-exclusive examples of suitable RF modulation schemes include amplitude modulation (AM), frequency modulation (FM), pulse code modulation (PCM), phase modulation (PM), or any combination of the foregoing. It is believed that modulation schemes used in modem technology may be particularly advantageous. The specific modulation scheme, however, is not critical to the invention, and any suitable modulation scheme may be used. Transceiver circuitry 610 also receives data from DUT 18 by detecting a signal transmission from DUT 18 on one or more of traces 28 and/or 30 and decoding the signal.

Figure 5:
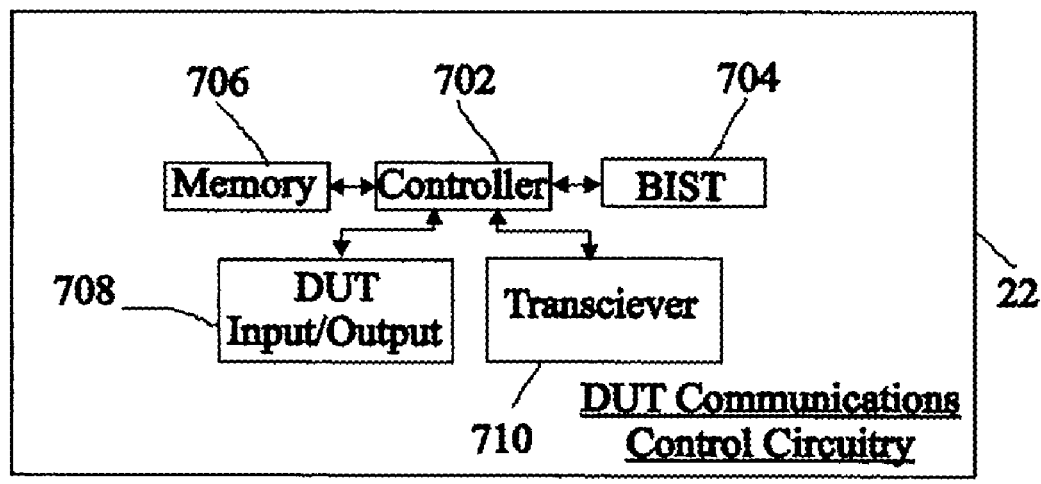
FIG. 5 illustrates exemplary DUT communications control circuitry.

FIG. 5 illustrates a simplified block diagram of an exemplary embodiment of DUT communications control circuitry 22 on DUT 18. DUT communications control circuitry 22 includes a controller 702, memory 706, DUT input/output circuitry 708, and transceiver circuitry 710. DUT communications control circuitry 22 may also include built-in-self-test ("BIST") circuitry 704, as is known in the field. Controller 702 controls overall operation of the communications control circuitry 22. Controller 702 may consist of hardwired wired logic circuitry or may be a processor operating under software control or a combination of hardwired logic circuitry and a software controlled processor. Memory 706 provides data storage, and software storage if controller 702 is a microprocessor. DUT input/output circuitry 708 provides input of signals from and output of signals to the functional circuitry (not shown) of DUT 18.

Transceiver circuitry 710 provides for communications of signals to and from board communications control circuitry 20 on interface board 16. That is, transceiver circuitry 710 sends data to board communications control circuitry 20 on interface board 16 by encoding the data and driving the encoded data on one or more of coupling pads 32 and/or 34. Transceiver circuitry 710 preferably encodes the data using any suitable radio-frequency (RF) modulation scheme, non-exclusive examples of which include previously mentioned amplitude modulation (AM), frequency modulation (FM), pulse code modulation (PCM), phase modulation (PM), or any combination of the foregoing. Again, it is believed that modulation schemes used in modem technology may be particularly advantageous. The specific modulation scheme, however, is not critical to the invention, and any suitable modulation scheme may be used. Transceiver circuitry 710 receives data from board communications control circuitry 20 on interface board 16 by detecting a signal transmission from the board communications control circuitry 20 on interface board 16 on one or more of coupling pads 32 and/or 34 and decoding the signal.

Of course, DUT 18 also includes functional circuitry (not shown) for carrying out the intended function of DUT 18. For example, if DUT 18 is a semiconductor memory chip, DUT 18 will include functional circuitry for storing data and providing access to the stored data. Indeed, as mentioned above, DUT 18 may be any type of electronic device, including without limitation a semiconductor die (singulated or unsingulated from a wafer, packaged or unpackaged), an electronic system comprising a plurality of electronic components, etc.

FIGS. 6-12 illustrate another exemplary embodiment. The exemplary test system 100 shown in FIG. 6 is a system for probing dies of an unsingulated semiconductor wafer in which contactless communications of test and response data is achieved by electromagnetic coupling as described above.

As shown in FIG. 6, test system 100 includes a tester 102, a test head 118, and a prober 120, all of which may be conventional. A communications link 104, which may be similar to communications link 14 shown in FIG. 1, provides electrical connections between the tester 102 and the probe head 118. As will be seen, the probe card provides electrical connections from the pogo pins 116 to the terminals of the dies being tested. The communications link 104, probe head 118, pogo pins 116, and probe card 106 thus provide a plurality of communications channels between the tester and the terminals on the dies of the wafer 124. Through these channels, the tester 102 writes test data to the dies on the wafer 124 and reads response data generated by the dies in response to the test data. Typically, one such channel is required for each terminal of the dies being tested, which means that the number of dies that can be tested at one time has traditionally been limited by the number of available channels.

A semiconductor wafer 124 to be tested is placed on a chuck (also commonly referred to as a stage) 114, which typically is capable of movement in the "x," "y," and "z" directions. The chuck 114 may also be capable of being rotated and tilted and may be further capable of other motions. (Directions are relative to the figures and are for illustration purposes only. Moreover, all motions, whether translational, rotational, or otherwise, are considered to be in one or a combination of the "x," "y," and/or "z" directions. For example, rotation about the "z" axis is movement in the "x" and "y" directions.) Once the semiconductor wafer 124 is placed on the chuck 114, the chuck is typically moved in the "x," "y" directions so that terminals on the dies (not shown in FIG. 6) of the wafer 124 are brought into electrical communications with the probe card 106. One or more cameras 122 may aid in aligning the wafer 124 and the probe card 106.

Once the terminals of the dies (not shown in FIG. 6) are in electrical communications with the probe card 106, the tester 102, which may be a computer, generates test data. The test data is communicated through the above-described channels to the dies (not shown in FIG. 6), and response data generated by the dies are likewise communicated through such channels back to the tester. As will be seen, the probe card 106 and the wafer are configured to communicate test signals contactlessly. Power and ground are also provided to the dies being tested; power and ground may originate from the tester and be provided through channels, or power and ground may originate at the prober or from some other location.

FIG. 7 shows an exemplary semiconductor wafer 124, modified for contactless communications with the probe card 106. Wafer 124 is conventional in the sense that a plurality of dies 202, 204, 206, 208, 210, 212, and 214 are formed on the wafer. The dies may be any type of integrated circuit chip, including without limitation a memory chip, a microprocessor or microcontroller, a signal processor, an analog chip, an application specific integrated circuit (ASIC), a digital logic circuit, etc. As is known, each die includes terminals for power and ground and for input and output signals. For ease of illustration, wafer 124 includes seven dies, and each die includes six terminals. Typically, however, many more (e.g., hundreds or thousands) of dies are formed on a wafer, and each die includes many more terminals for power, ground, and input/output signals. In the example shown in FIG. 7, the left terminal (222a on die 202, 224a on die 204, 226a on die 206, 228a on die 208, 230a on die 210, 232a on die 212, and 234a on die 214) on each die is for power and the right terminal (222f on die 202, 224f on die 204, 226f on die 206, 228f on die 208, 230f on die 210, 232f on die 212, and 234f on die 214) on each die is for ground. The four inner terminals (222b-e on die 202, 224b-e on die 204, 226b-e on die 206, 228b-e on die 208, 230b-e on die 210, 232b-e on die 212, and 234b-e on die 214) on each die are for input and output signals, which may represent such things as data, address, control signals, status signals, etc. (The term data is used herein broadly to include data signals, address signals, control signals, status signals, etc., as well as test signals generated by the tester that are to written to the dies and response signals generated by the dies.) As shown, each die on wafer 124 also includes a set of four electromagnetic coupling pads (242b-e on die 202, 244b-e on die 204, 246b-e on die 206, 248b-e on die 208, 250b-e on die 210, 252b-e on die 212, and 254b-e on die 214). As generally described above, these electromagnetic coupling pads, which may be permanent structures or temporary structures that are removed from the wafer after testing the wafer or the die, facilitate contactless communications between wafer 124 and probe card 106.

FIGS. 8A, 8B, 9A, and 9B illustrate an exemplary probe card 106 configured to interface with the wafer 124 of FIG. 7. FIG. 8A is a top view and FIG. 9A is a bottom view of the probe card 106. FIGS. 8B and 9B are cross-sectional side views of the probe card 106. (Use of the terms top, bottom, side, left, right, etc. herein are relative to the figures and are exemplary and used for ease of explanation. Use of these terms should not be taken as limiting.)

The exemplary probe card 106 comprises a substrate 302, which may be any type of substrate including without limitation a printed circuit board or a ceramic. As shown in FIG. 8A, pogo pin pads for making electrical connections with pogo pins 116 (see FIG. 6) are disposed on a top surface 304 of the substrate 302. The exemplary probe card 106 shown in FIG. 8A includes three sets of pogo pads 312, 314, and 316, each set including sufficient pogo pads for receiving power, ground, and input/output signals for testing one die. The first set of pogo pads 312 include pads 312a-312f, in which pogo pad 312a is for receiving power, pogo pad 312f is for receiving ground, and pogo pads 312b, 312c, 312d, and 312e are for input/output data signals for one die. (As discussed above, each of the six pads 312a-312f in set 312 correspond to six channels to the tester, assuming power and ground are delivered from the tester using two channels.) The second set of pogo pads 314 similarly includes one pad for receiving power 314a, one pad for receiving ground 314f, and four pads 314b, 314c, 314d, and 314e for data signals. The third set of pogo pads 316 is also similar, that is, pad 316a receives power, pad 316f receives a ground connection, and pads 316b, 316c, 316d, and 316e are for data signals into and out of one die.

Each of the power pogo pads 312a, 314a, and 316a are connected by a conductive via (not shown) to a power plane 308 embedded in substrate 302 (see FIGS. 8B and 9B). Although not shown, an electrically insulated passage through ground plane 310 is provided for the vias. Each of the ground pogo pads 312f, 314f, and 316f are likewise connected by a conductive via (not shown) to a ground plane 310, also embedded in substrate 302 (see FIGS. 8B and 9B). As shown in FIG. 8A, three sets of electrically conductive traces 324, 326, and 328 connect the signal data pogo pads in the three pogo pad sets 312, 314, and 316 to three communications control chips 318, 320, and 322. (Operation of the communications control chips is discussed below.) That is, traces 324 connect data pogo pads 312b, 312c, 312d, and 312e to communications control chip 318. Traces 326 similarly connect data pogo pads 314b, 314c, 314d, and 314e to communications control chip 320, and traces 328 connect data pogo pads 316b, 316c, 316d, and 316e to communications control chip 322.

Referring now to FIG. 9A, the bottom 306 of substrate 302 includes a plurality of electrically conductive probes 402a, 402f, 404a, 404f, 406a, 406f, 408a, 408f, 410a, 410f, 412a, 412f, 414a, and 414f. Each of these probes is connected through an electrically conductive via to one of the power plane 308 or the ground plane 310. FIG. 9B shows one such via 430, which connects power probe 406a to power plane 308 and another such via 432, which connects ground probe 406f to ground plane 310. Although not shown, an electrically insulated passage through ground plane 310 is provided for via 430. Voltage regulators, decoupling capacitors, or similar circuits elements may optionally be included. Each probe is positioned on substrate 302 to correspond to one of the power or ground terminals on one of the dies of wafer 124 so that the power and ground terminals on the dies can be brought into contact with the probes (see FIG. 10) to power the dies during test. (Probes 402a, 402f, 404a, 404f, 406a, 406f, 408a, 408f, 410a, 410f, 412a, 412f, 414a, and 414f may be any type of probes, including without limitation needle probes, buckling beam probes, bumps, posts, or spring probes. Nonexclusive examples of spring probes include the spring contacts described in U.S. Pat. Nos. 5,917,707, 6,255,126, 6,475,822, and 6,491,968; and U.S. Patent Application Publication No. 2001/0044225 A1 and U.S. Patent Application Publication No. 2001/0012739 A1.)

Figure 10:
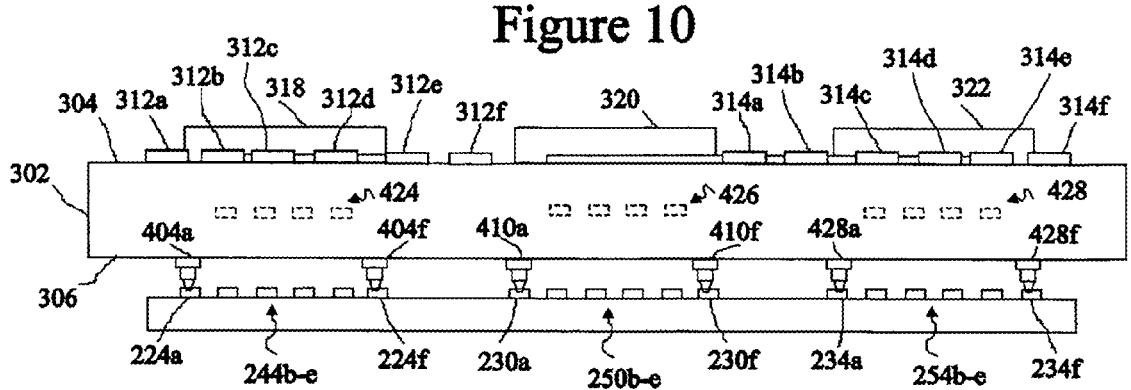
FIG. 10 shows a side-view of the probe card of FIG. 8A and the wafer of FIG. 7.

As shown in FIGS. 8B, 9A, 9B, and 10 three sets of electrically conductive coupling traces 424, 426, and 428 are embedded in substrate 302. (Because the conductive trace sets 424, 426, and 428 are embedded within substrate 302, they are shown in dashed lines in FIG. 9A.) The three sets of coupling traces 424, 426, and 428 in substrate 302 correspond to the three columns of dies on wafer 124, and each trace corresponds to one electromagnetic coupling pad on each of the dies in a column on wafer 124. That is, as shown in part in FIG. 10, while probes 402a, 402f, 404a, 404f, 406a, 406f, 408a, 408f, 410a, 410f, 412a, 412f, 414a, and 414f are in contact with power and ground terminals 222a, 222f, 224a, 224f, 226a, 226f, 228a, 228f, 230a, 230f, 232a, 232f, 234a, 234f (as shown in FIG. 10), the four coupling traces in trace set 424 are electromagnetically coupled to coupling pads 242b-e and 244b-e on dies 202 and 204. More specifically, coupling trace 424b is electromagnetically coupled to coupling pad 242b on die 202 and coupling pad 244b on die 204. Similarly, trace 424c is electromagnetically coupled to coupling pads 242c and 244c on dies 202 and 204, respectively; coupling trace 424d is electromagnetically coupled to coupling pads 242*d* and 244*d* on dies 202 and 204, respectively; and coupling trace 424*e* is electromagnetically coupled to coupling pads 242*e* and 244*e* on dies 202 and 204, respectively. In like manner, the four coupling traces in trace set 426 are electromagnetically coupled to the electromagnetic coupling pads 246*b-e*, 248*b-e*, and 250*b-e* on dies 206, 208, and 210, and the coupling four traces in trace set 428 are electromagnetically coupled with the electromagnetic coupling pads 252*b-e* and 254*b-e* on dies 212 and 214. In this way, test signals are passed between the probe card 106 and the dies on the wafer 124 without physical contact between the probe card and the data terminals of the dies.

Referring again to FIG. 8A, communications control chips 318, 320, and 322 are each configured to control the contactless transmission of data between probe card 106 and wafer 124. In the example shown in FIG. 8A, there are three communications control chips 318, 320, and 322. As discussed above, the probe card 106 shown in FIG. 8A includes pogo pads for connecting to enough tester channels to test three dies at one time. (Pogo pad set 312 receives power and ground and provides sufficient signal input and output for testing one die, and pogo pad sets 314 and 316 similarly each receives power and ground and provides sufficient signal input and output for testing one die each.) Thus, in the example shown in FIG. 8A, there is one communications control chip for each set of tester channels for testing one die. (There need not, however, be such a one-to-one correspondence.) As shown in part in FIG. 8B, each communications control chip 318, 320, and 322 is electrically connected by conductive vias to one of coupling trace sets 424*b-e* 426*b-e*, or 428*b-e* in substrate 302. Shown in FIG. 8B are vias 326 into substrate 302, which connect communications control chip 320 to coupling trace set 426*b-e*, and vias 328, which connect communications control chip 322 to coupling trace set 428*b-e*. Although not shown similar vias connect communications control chip 318 to coupling trace set 424*b-e*. Also not shown, insulated passages are provided through the power plane 308 for the vias. Probe card 106 and wafer 124 may include shielding as generally described above with respect to FIGS. 2A and 2B.

It should be apparent that, in this example, tester channels sufficient to test one die are provided through pogo pads in pogo set 312 to communications control chip 318, which is electromagnetically coupled to dies 202 and 204. Test data for one die is thus communicated from the tester 102 to communications control chip 318, which communicates that test data contactlessly to dies 202 and 204. Communications control chip 318 then contactlessly reads response data generated by dies 202 and 204 and sends the response data back to the tester 102 through ones of channels represented by ones of pogo pads in pad set 312. Communications control chip 320 similarly provides an interface between the tester 102 and dies 206, 208, and 210; and communications control chip 322 provides an interface between the tester 102 and dies 212 and 214.

Communications control chips 318, 320, and 322 may be generally similar to board communications control circuitry 20 shown in FIG. 4. For example, tester interface input/output circuitry 608 (see FIG. 4) in communications control chip 318 provides input of signals from and output of signals to pogo pads 312*b*, 312*c*, 312*d*, and 312*e* in pogo pad set 312 (see FIG. 8A). Depending on the tester 102 and the terminals of the dies on the wafer 124, a particular pogo pad may be an input pad for only receiving signals from the tester, a particular pad may be an output pad for only sending signals to the tester, or a particular pad may be an input/output pad for both receiving and sending signals. Similarly, tester interface input/output circuitry 608 in communications control chip 320 provides input of signals from and output of signals to pogo pads 314*b*-314*e* in pogo pad set 314, and tester interface input/output circuitry 608 in communications control chip 322 provides input of signals from and output of signals to pogo pads 316*b*-316*e* in pogo pad set 316.

Transceiver circuitry 610 (see FIG. 4) in communications control chip 318 provides for communication of signals to and from dies 202 and 204 via traces 424*b-e* (see FIG. 4A) and also receives data from die 202 or die 204 by detecting a signal transmission from either of the dies on one or more of coupling traces 424*b-e* and decoding the signal. For example, the transceiver circuitry 610 in communications control chip 320 would similarly provide for communications to and from dies 206, 208, and 210 via coupling traces 426*b*-246*e*, and the transceiver circuitry 610 in communications control chip 322 would similarly provide for communications to and from dies 212 and 214 via coupling traces 428*b*-248*e*.

Each of dies 202, 204, 206, 208, 210, 212, and 214 may include, in addition to functional circuitry (not shown) for carrying out the intended function of the die (e.g., if the die is a memory, the die will include functional circuitry for storing data and providing access to the stored data), communications control circuitry for controlling contactless communications with one of communications control chips 318, 320, or 322. The communications control circuitry in each die 202, 204, 206, 208, 210, 212, and 214 may be generally similar to the DUT communications control circuitry 22 shown in FIG. 5 and discussed above. For example, transceiver circuitry 710 provides for communications of signals to and from one of communications control chip 318, 320, or 322. For example, the transceiver circuitry 710 on die 202 sends data to communications control chip 318 by encoding the data and placing the encoded data on one or more of electromagnetic coupling pads 242*b-e*. Transceiver circuitry 710 on die 202 would receive data from communications control chip 318 by detecting a signal transmission from the communications control chip 318 on one or more of coupling pads 242*b*-242*e* and decoding the signal.

As generally described above, contactless communications may take place between communications control chip 318 and dies 202 and 204 because ones of coupling traces 424*b-e* on probe card 106 are disposed in sufficient proximity to ones of coupling pads 242*b-e* on die 202 and coupling pads 244*b-e* on die 204. As also described above, this results in an electromagnetic coupling of ones of coupling traces 424*b-e* on probe card 106, on one hand, and coupling pads 242*b-e* on die 202 and coupling pads 244*b-e* on die 204, on the other hand. More specifically, coupling trace 424*b* is electromagnetically coupled to coupling pad 242*b* on die 202 and to coupling pad 244*b* on die 204; coupling trace 424*c* is electromagnetically coupled to coupling pad 242*c* on die 202 and to coupling pad 244*c* on die 204; coupling trace 424*d* is electromagnetically coupled to coupling pad 242*d* on die 202 and to coupling pad 244*d* on die 204; and trace 424*e* is electromagnetically coupled to coupling pad 242*e* on die 202 and to coupling pad 244*e* on die 204. As discussed above, because of this electromagnetic coupling, a signal provided to one of coupling traces 424*b-e* on probe card 106 by transceiver circuitry 610 in communications control chip 318 induces a similar signal in the corresponding electromagnetic coupling pads 242*b-e* and 244*b-e* to which the coupling trace 424*b-e* is coupled. For example, a signal provided by transceiver circuitry 610 to coupling trace 424*b* on probe card 106 induces a similar signal in coupling pads 242*b* and 244*b*, which is detected and decoded by the transceiver circuitry 710 in both die 202 and 204. As another example, a signal provided by transceiver circuitry 710 in die 202 to coupling pad 242d on die 204 induces a similar signal in trace 424d on probe card 106, which is detected and decoded by transceiver circuitry 610 in communications control chip 318.

As is known, the amount of attenuation that occurs between a signal in an electromagnetic coupling pad (e.g., 242b) and the signal generated in the corresponding coupling trace (e.g., 424b) on probe card 106 or between a signal in the coupling trace and the signal generated in the electromagnetic coupling pad can be readily designed into the system. The following is a nonexclusive list of parameters that affect the amount of attenuation: the proximity of the electromagnetic coupling pad (e.g., 242b) to the trace (e.g., 424b); the physical orientation of the electromagnetic coupling pad (e.g., 242b) to the trace (e.g., 424b); the length of the electromagnetic coupling pad (e.g., 242b) relative to the wavelength of the carrier signal; the shape of the electromagnetic coupling pad (e.g., 242b) and the trace (e.g., 424b). Using these and other parameters affecting coupling known to persons skilled in the field, the attenuation of signals wirelessly passed between the electromagnetic coupling pads (e.g., 242b) and the traces (e.g., 424b) can be designed into the system.

It should be noted, however, that when electromagnetic coupling pads of a large number of dies on wafer 124 are tightly coupled (that is, coupled so as to reduce substantially the amount of attenuation) to a coupling trace on probe card 106, each electromagnetic coupling pad may draw a substantial amount of power from the RF signal as it travels along the coupling trace, and the RF signal can become severely attenuated by the time it reaches a die at the end of a coupling trace. In such a case, it is preferable to design electromagnetic coupling pads to be less tightly coupled to the coupling traces so that they do not draw substantially more power than needed to permit an incoming RF signal to be properly detected by a transceiver. Thus, generally speaking, loose coupling is preferred over tight coupling, particularly in systems where many devices share a common coupling trace. However, in systems where only a small number of dies are coupled together, tighter coupling may be desired to reduce attenuation between devices and reduce undesirable radiation. For example, tighter coupling may be appropriate in systems having eight or fewer dies electromagnetically coupled to a coupling trace.

Table I below summarizes three link budget analyses applicable over a broad range of operating conditions for a trace (e.g., 424b) on probe card 106 coupled to electromagnetic coupling pads (e.g., 242b and 244b) on dies 202 and 204, given the following exemplary parameters. A carrier frequency in the range of 1-10 GHz is assumed, and electromagnetic coupling pads 242b and 244b on dies 202 and 204 are about 2-3 millimeters long. (The aforementioned frequency range (1-10 GHz) is exemplary only. Higher frequencies to beyond 100 GHz may be used.) Trace 424b on probe card 106 is about 150 micron wide. It should be stressed that the above dimensions are exemplary only and given as a framework for the discussion that follows of exemplary link budget analyses. The invention is not limited to the above described dimensions or the below described operating ranges.

Exemplary case #1 through case #3 of table I represent decreasing system cost and complexity at the expense of decreasing data rate performance. The Noise power Ni in milliwatts is given by the formula:

$Ni=1000 \ kTeB$,

Where:

$k=1.38\times10^{-23}$ Joules/Degree (Boltzmann's constant)

$Te=(F-1)To$ $To=370$ K (100 degrees C.)

F=Noise Figure of Receiver

B=Frequency bandwidth in Hz

Therefore the available signal bandwidth for a given Signal to Noise Ratio (SNR) can be computed in dBm from: Ni (dBm) =10 Log [1000 k Te B] Solving for B: B=[10 ^(Ni (dBm)/ 10)]/[1000 k Te]

0.3 bits/Hz is the approximate bandwidth required for a bipolar phase shift keying (BPSK) digital modulation scheme in a modest implementation. More complex modulation schemes and circuitry are capable of yielding higher bits/Hz densities. Likewise, spread spectrum techniques can yield lower bit/Hz densities while yielding lower bit error rates at lower SNR ratios at the expense of additional system complexity.

Exemplary case # 1 represents a link budget where the system transmitter voltage (e.g., transceiver 610 of FIG. 4) is 2.4 volts peak-to-peak into a 50 ohm (+11.6 dBm), an 18 dB transmitting trace 424b on probe card 106 loss is used, the receiving electromagnetic coupling pads 242b and 244b on dies 202 and 204 have an additional 18 dB loss, and other system losses total 6 dB. In this case the desired link margin is 10 dB and the desired signal to noise ratio (SNR) is 25 dB. A conservative transceiver implementation noise of 8 dB is assumed. Hence, the available noise bandwidth is over 10 GHz, corresponding to a 3 Giga-bit/second (Gb/sec) data rate at 0.3 bit per Hz of bandwidth. In this case, the signal level power would not necessarily be a limiting factor of the implementation.

Exemplary case #2 represents a link budget where the transmitter (e.g., transmitter 610 in FIG. 4) voltage is reduced 6 dB to 1.2 volts peak-to-peak into a 50 ohms (+5.5 dBm), along with a more lossy 22 dB transmitting trace 424b on probe card 106, together with the receiving electromagnetic coupling pads 242b and 244b on dies 202 and 204 have, representing an additional 22 dB loss. The link margin of case # 2 has been decreased to a still conservative value of 8 dB. The noise figure of the receiver implementation has been increased to 9 dB. This system would represent a more economical system to implement than the system illustrated by case #1. In case #2, the available noise bandwidth is 1.6 GHz, corresponding to a 480 Mb/second (Mb/sec) data rate assuming 0.3 bit per Hz of bandwidth.

Exemplary case #3 further reduces the transmitter voltage to 0.63 volts peak-to-peak (0 dBm) and further increases system implementation losses and reduces the link margin of the systems illustrated in Cases #1 and #2 above. Case #3 is representative of an even lower cost implementation that nonetheless supports a 81 Mb/sec data channel.

Together, exemplary cases #1 through #3 represent a broad range of operating conditions for various transmitter levels, receiver implementations and signal bandwidths. Many operating conditions outside the range of values of Table I could be implemented by those skilled in the art.

TABLE I

|  | Units | Case #1 | Case #2 | Case #3 |
| --- | --- | --- | --- | --- |
| Voltage output of transmitter | volts p-p | 2.4 | 1.2 | 0.63 |
| RMS voltage = Vp-p/2.88 | volts rms | 0.83 | 0.42 | 0.22 |
| Transmitter output (milliwatts into 50 ohms) | dBm | 11.6 | 5.5 | 0.0 |
| Outgoing Coupling Loss | dB | 18 | 22 | 26 |

TABLE I-continued

|  | Units | Case #1 | Case #2 | Case #3 |
|---|---|---|---|---|
| Incoming Coupling Loss | dB | 18 | 22 | 26 |
| PCB and other System Losses | dB | 6 | 6 | 6 |
| RE Signal power at receiver | dBm | −30 | −44 | −58 |
| Desired link margin | dB | 10 | 8 | 6 |
| Desired SNR | dB | 25 | 20 | 15 |
| Noise power budget | dBm | −65 | −72 | −79 |
| Noise Figure Of receiver | dB | 8 | 9 | 10 |
| Noise Figure Of receiver (F) | ratio | 6 | 8 | 10 |
| Equivalent Noise Temperature Te = (F − 1) × 370 | degree K | 1965 | 2569 | 3330 |
| Available signal Bandwidth | Hz | 10.6E+9 | 1.6E+9 | 270.8E+6 |
| Bit Rate at 0.3 bit/Hz [BPSK] | Mb/Sec | 3,168 | 481 | 81 |

Figure 11:
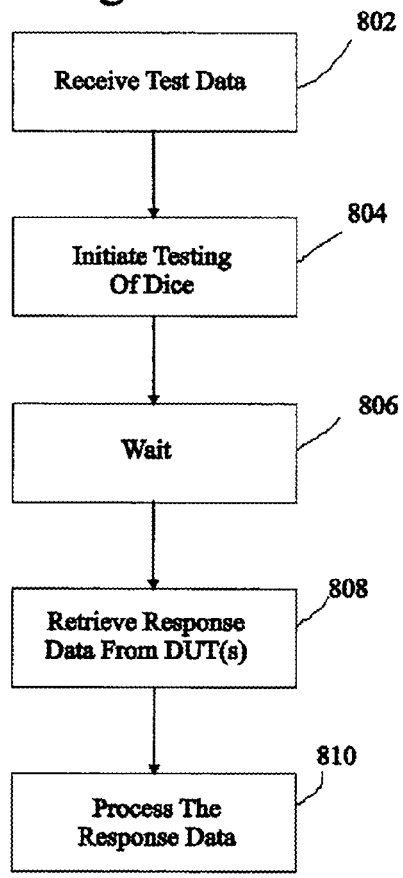
FIG. 11 illustrates exemplary operation of a communications control chip of FIG. 8A.
Figure 12:
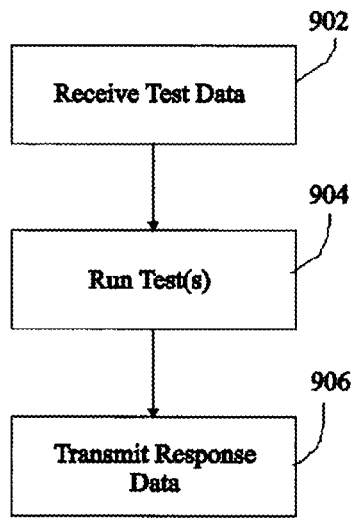
FIG. 12 illustrates exemplary operation of communications control circuitry on each of the dies of the wafer of FIG. 7.

FIG. 11 illustrates exemplary operation of communications chip 318 (configured as shown in FIG. 4), and FIG. 12 illustrates exemplary operation of communications control circuitry on dies 202 and 204 (each configured as shown in FIG. 5). (Communications chips 320 and 322 may also operate as shown in FIG. 11, and each of dies 206, 208, 210, 212, and 214 may also operate as shown in FIG. 12.) To facilitate discussion of FIGS. 11 and 12, it is assumed that dies 202 and 204 are logic circuits, and terminals 222b and 222c on die 202 are for input signals and the output generated by the logic circuits in response to the inputs on terminals 222b and 222c appears on terminals 222d and 222e of die 202. Die 204 is similar, with terminals 224b and 224c being input terminals and terminals 224d and 224e being output terminals. Dies 202 and 204 are tested by writing one or more patterns of inputs into the input terminals and determining whether the outputs appearing on the output terminals is as expected.

As shown in FIG. 11, communications control chip 318 receives test data from tester 102 (see FIG. 6) at step 802. In this example, the test data comprises two input signals for a die, and those input signals are received through pogo pads 312b and 312c. Note that, from the tester's perspective, this test data is for testing only one die on wafer 124. This test data is received by the tester interface input/output circuitry 608 of communications chip 318.

At step 804, processor 602 initiates testing of dies 202 and 204. In this example, processor 602 passes the test data to transceiver circuitry 610, which modulates the test data received through pogo pad 312b and drives the modulated signal onto coupling trace 242b. As discussed above, this causes a similar signal (containing the test data received from the tester 102 at pogo pad 312b) to be induced in coupling pads 242b and 244b on dies 202 and 204. Transceiver circuitry 610 also modulates the test data received through pogo pad 312c and places that modulated signal on coupling trace 242c, which induces a similar signal in coupling pads 242c and 244c on dies 202 and 204.

At step 806, processor 602 waits for response data generated by dies 202 and 204. The step of waiting 806 may be accomplished in any of many different ways. For example, the processor 602 may simply wait for a specified period of time, or the processor 602 may wait for signals from the dies 202 and 204 that response data is ready. Other techniques may alternatively be used.

After waiting for the dies 202 and 204 to complete the testing at step 806, processor 602 in communications control chip 318 retrieves the response data generated by dies 202 and 204. There are many ways for processor 602 to retrieve data from dies 202 and 204, and any suitable way may be used. As just one example, controller 602 may poll each die, requesting that each die 202 and 204 send their response data at different times. A polling request may be sent using contactless communications as described above.

After receiving response data from both dies 202 and 204, processor 602 processes the response data at step 810. In this example, the processor 602 processes the response data by simply sending the response data for both die 202 and 204 to the tester 102 along with identifiers identifying the dies that produced the response data. The response data for both dies 202 and 204 is sent via pogo pads 312d and 312e. Some sort of time division multiplexing scheme may be used to transmit the test results for two dies (202 and 204) over tester channels configured for only one die.

As mentioned above, communications control chip 320 may also operate as shown in FIG. 11, receiving test data via pogo pads 314b and 314c; contactlessly sending that test data to the input terminals (terminals 226b and 226c of die 206, terminals 228b and 228c of die 208, and terminals 230b and 230c of die 210) of dies 206, 208, and 210; receiving response data contactlessly from dies 206, 208, and 210 generated at their output terminals (terminals 226d and 226e of die 206, terminals 228d and 228e of die 208, and terminals 230d and 230e of die 210); and sending to the tester 102 the response data generated by dies 206, 208, and 210 via pogo pads 314d and 314e using time division multiplexing or some other scheme. Likewise, communications control chip 322 may operate as shown in FIG. 11, receiving test data via pogo pads 316b and 316c; contactlessly sending that test data to the input terminals (terminals 232b and 232c of die 212 and terminals 234b and 234c of die 214) of dies 212 and 214; receiving response data contactlessly from dies 212 and 214 generated at their output terminals (terminals 232d and 232e of die 212 and terminals 234d and 234e of die 214); and sending to the tester 102 the response data generated by dies 212 and 214 via pogo pads 316d and 316e.

Referring now to FIG. 12, the controller 702 (see FIG. 5) in each of dies 202 and 204 executes the process shown in FIG. 12. Note that the process shown in FIG. 12 executes independently on the controllers 702 in both dies 202 and 204. At step 902, the controller 702 receives the test data sent by communications control chip 318 at step 804 of FIG. 11. More specifically, transceiver circuitry 710 in die 202 detects the signals induced in coupling pads 242b and 242c (see above), which contains the test data for die 202. The transceiver circuitry 710 in die 204 detects the same signals. (Note that these signals contain the test data received from the tester at pogo pads 312b and 312c.)

At step 904, controller 702 in die 202 runs the tests indicated by the received data on die 202, and controller 702 in die 204 also runs the tests on die 204. In this example, the controller 702 in die 202 writes the test data received on coupling pad 242b to input terminal 222b of die 202, and the controller 702 in die 202 writes the test data received on coupling pad 242c to input terminal 222c of die 202. The controller 702 in die 204 similarly writes the test data received on coupling pad 244b to terminal 224b of die 204 and writes the test data received on coupling pad 244c to terminal 224c of die 204. As discussed above, in this example, dies 202 and 204 are logic dies; in response to data written to their input terminals, the dies generate output at their output terminals. Thus, die 202 generates output on its output terminals 222d and 222e, and die 204 generates output on its output terminals 224d and 224e. Controller 702 on die 202 reads the response data generated by die 202 through DUT input/output circuitry 708 and stores the response data in memory 706 on die 202. Controller 702 on die 204 similarly reads the response data generated by die 204 and stores the response data on memory 706 on die 204.

At step 906, the controllers in dies 202 and 204, upon receiving the request for response data sent by communications control chip 318 at step 808 of FIG. 11, send the response data generated by each die to communications control chip 318. More specifically, the controller 702 in die 202 sends the output data to the transceiver circuitry 710. That is, transceiver circuitry 710 in die 202 modulates the output data read from terminal 222d of die 202 into a signal that is placed on coupling pad 242d, and the transceiver circuitry modulates the output data read from terminal 222e into a signal that is placed on coupling pad 242e. The modulated signal on coupling pad 242d induces a similar signal on trace 242d on probe card 106, and the modulated signal on coupling pad 242e induces a similar signal on trace 424e. The transceiver circuitry 710 in die 204 similarly places modulated signals containing response data from terminals 224d and 224e (read and stored in memory 706 as described above) onto its coupling pads 244d and 244e, which induce similar signals on traces 424d and 424e.

As should be apparent, it is possible that die 202 and die 204 could send their response data at the same time, which would garble the signals received by communications control chip 318. There are many ways to effect orderly transmission of the response data so that such garbling is avoided. For example, as mentioned above, each die 202 and 204 may wait for a polling request from the communications control chip 318 and transmit the test results data only after receiving such a polling request. Alternatively, dies 202 and 204 may communicate with one another to coordinate separate transmissions of their response data. Other techniques may also be used. The communications control circuitry 22 (see FIG. 5) in each of dies 206, 208, 210, 212, and 214 may also operate as shown in FIG. 12.

The processes shown in FIGS. 11 and 12 may be repeated multiple times to effect thorough testing of each of the dies 202, 204, 206, 208, 210, 212, and 214 on wafer 124.

It should be apparent that the processes shown in FIGS. 11 and 12, as described above, are exemplary only, and many variations and substitutions are possible. For example, as described above with respect to step 804 in FIG. 11, the processor 602 in communications control chip 318 merely retransmits the same test data that the communications control chip received from the tester at step 802. Alternatives are possible, however. For example, the test data received from the tester at step 802 may cause communications control chip 318 to look up a particular test vector or test vectors stored in memory 606 and then transmit that test vector or test vectors to dies 202 and 204. As yet another example, the test data received from the tester at step 802 may cause communications control chip 318 to look up a particular test command or sequence of commands stored in memory 606 and then transmit that command or sequence of commands to dies 202 and 204. Of course, some combination of the forgoing scenarios is also possible. Other scenarios are also possible.

As described above, at step 810, processor 602 of communications control chip 318 processes the test response data received from dies 202 and 204 by simply sending the raw response data from each die 202 and 204 to the tester over the channels connected to pogo pads 312d and 312e. Again, alternatives are possible. For example, the processor 602 may append data (e.g., an identifier identifying the die 202 or 204 that generated the particular test response data) to the response data. As another example, the processor 602 may analyze the test response data and send results of the analysis to the tester 102. The processor 602 may also do such things as compress the test results data, format the data, etc. Alternatively, the processor 602 may send the test response data somewhere other than the tester, or the processor 602 may simply store the test response data on the probe card 106, from which it is later retrieved by an operator of the test system 100.

Similarly, the communications control circuitry 22 (see FIG. 5) in a die may execute the step of running tests 904 in a variety of ways. If the test data received by the communications control circuitry 22 are one or more test commands, the controller 702 will take whatever action is indicated by the command or commands. For example, a command may cause the controller to initiate BIST circuitry 704, which then runs one or more self tests on the die 202 or 204. As another example, a command may cause controller 702 to look up one or more test vectors stored in storage 706, which are written to the input terminals 222b and 222c of die 202.

Figure 13:
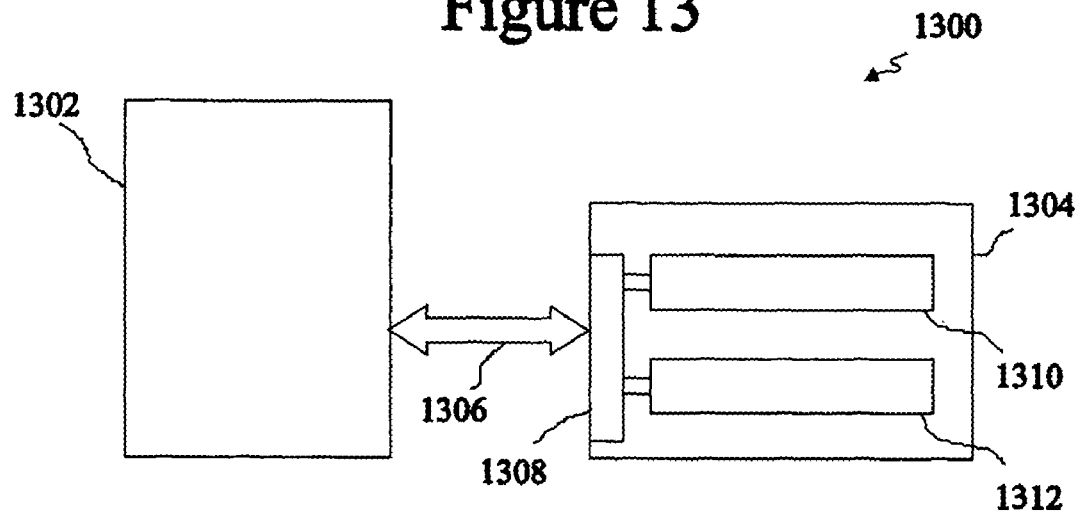
FIG. 13 illustrates another exemplary test system.

FIGS. 13-19 illustrate yet another embodiment. As shown, FIG. 13 illustrates another exemplary test system 1300 for testing electronic devices. Test system 1300 includes a tester 1302, a test station 1304, and a communications like 1306. Tester 1302 may be any tester for testing electronic devices, such as semiconductor dies of an unsingulated semiconductor wafer or singulated dies (packaged or unpackaged). Such testers are known, and any suitable tester may be used. Test station 1304 includes one or more cassettes 1310 and 1312 (two are shown for purposes of illustration). The cassettes 1310 and 1312 hold the electronics devices to be tested and are electrically connected to a communications back plane 1308. A communications link 1306, which may be similar to communications link 14 in FIG. 1, provides communications between tester 1302 and test station 1304. Back plane 1308 provides an interface to communications link 1306 and each of the cassettes 1310 and 1312 and thus, electrically connects communications link 1306 to each of cassettes 1310 and 1312. In the basic operation of test system 1300, tester 1302 generates test data that is communicated to the electronic devices under test in each cassette 1310 and 1312, and response data generated by the devices under test are sent back to the tester 1302. The communications path between the tester 1302 and the devices under test includes communications link 1306, back plane 1308, and the cassettes 1310 and 1312.

Figure 14A:
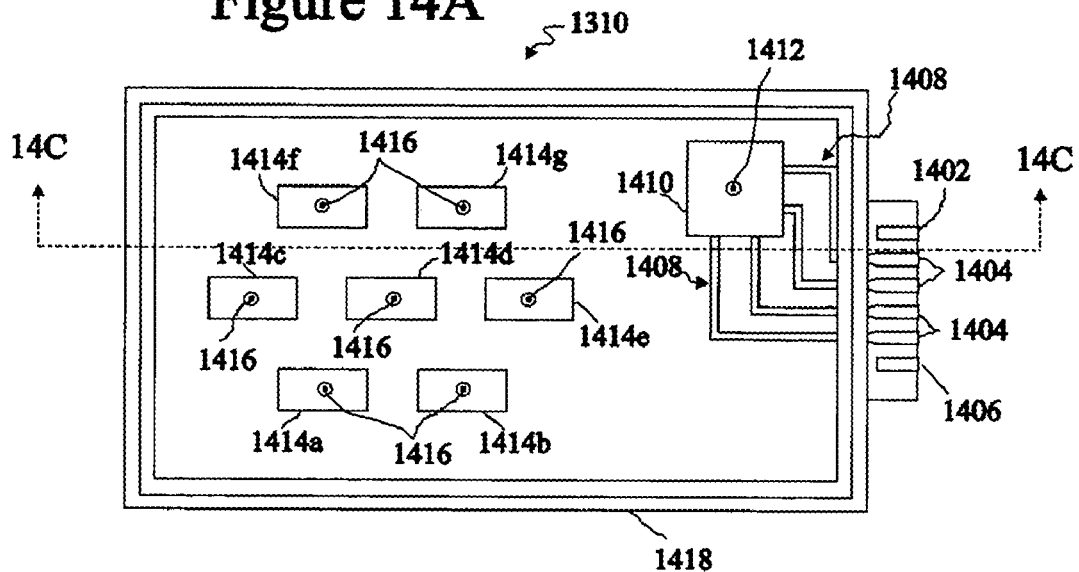
FIG. 14A illustrates a top view of an exemplary cassette with its cover removed.
Figure 14B:
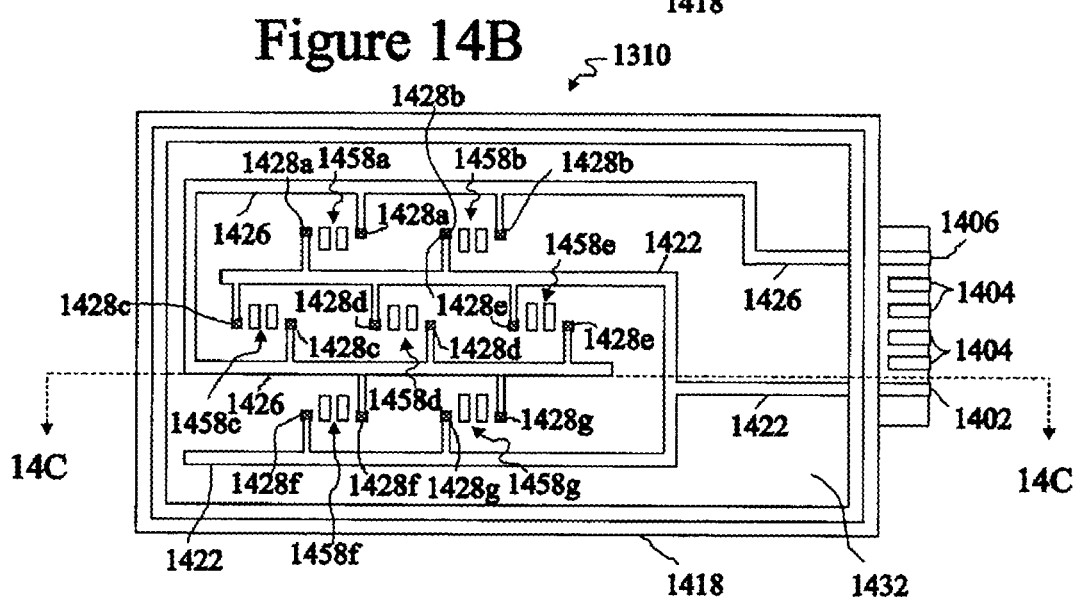
FIG. 14B illustrates a bottom view of the cassette of FIG. 14A with its device plate removed.
Figure 14C:
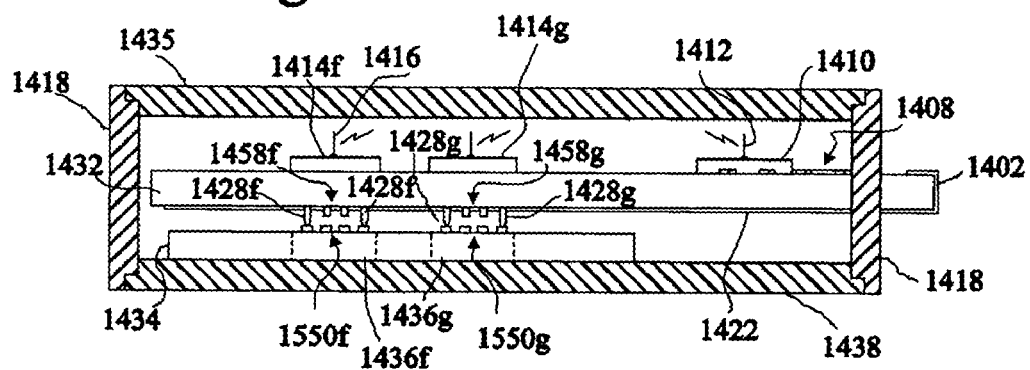
FIG. 14C illustrates a cross-sectional side view of the cassette of FIG. 14A with its cover and device plate.

FIGS. 14A, 14B, and 14C illustrate an exemplary embodiment of a cassette 1310. Cassette 1312 may be similar. (FIG. 14A shows a top view of the cassette 1310 with its cover 1435 removed; FIG. 14B shows a bottom view of the cassette 1310 with the device plate 1438 removed; FIG. 14C shows a cross-sectional side view of the cassette 1310 with the cover 1435 and device plate 1438 in place.)

Figure 15:
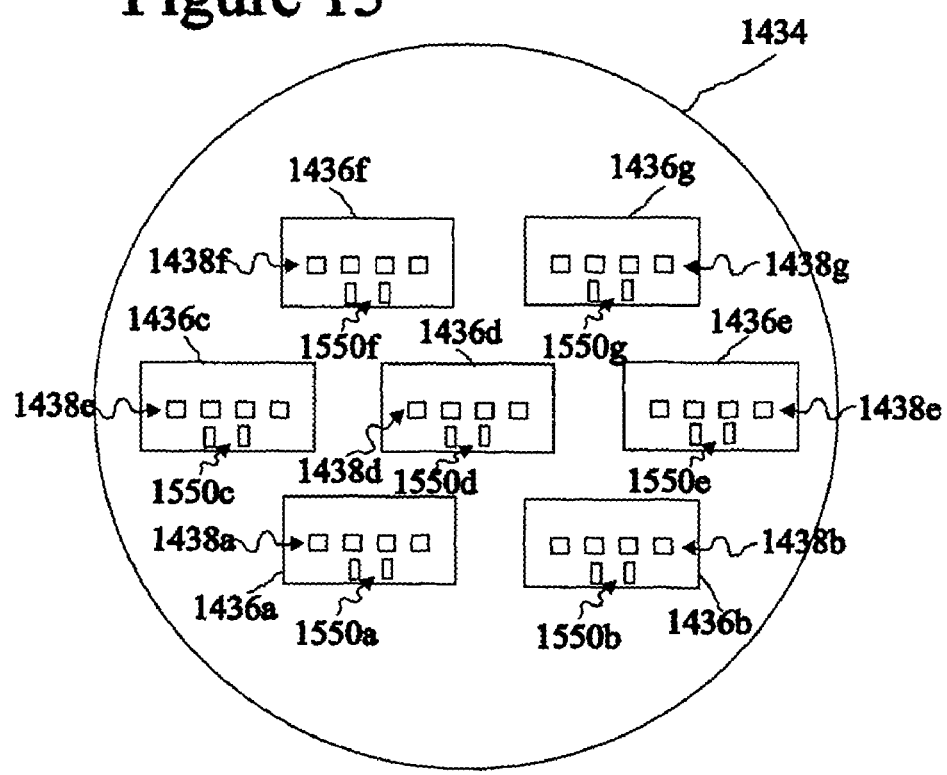
FIG. 15 illustrates another exemplary wafer.

The exemplary cassette 1310 shown in FIGS. 14A-14C includes a frame 1418, a cover 1435, and a device plate 1438 for holding the electronic devices to be tested. In this example, the electronic devices to be tested are the dies of an unsingulated wafer 1434, which is shown in FIG. 15. As shown in FIG. 15, exemplary wafer 1434 comprises seven dies 1436a, 1436b, 1436c, 1436d, 1436e, 1436f, and 1436g, and each die includes a set of four terminals 1438a, 1438b, 1438c, 1438d, 1438e, 1438f, and 1438g in which the outer terminals are for ground and power, respectively, and the inner two terminals are for data input/output into and out of the die. (The number and arrangement of the dies on the wafer as well as the number and arrangement of terminals on each die are for illustration and discussion purposes only; any number and arrangement of dies on the wafer and terminals on each die may be used.) Sets of contactless coupling pads 1550a, 1550b, 1550c, 1550d, 1550e, 1550f, and 1550g are also included on each of the die. The devices being tested need not, however, be dies of an unsingulated wafer but may be any type of electronic devices, including without limitation singulated dies (packaged or unpackaged). For example, device plate 1438 may include a tray for holding singulated dies.

Referring again to FIGS. 14A-14C, the frame 1418, cover 1435, and device plate 1438 form an enclosure. In the enclosure are a test board 1432 and the wafer 1434, which is supported by the device plate 1438. The test board 1432 includes a plurality of edge connectors 1402, 1404, and 1406 that extend outside of the enclosure formed by the frame 1418, cover 1435, and device plate 1438 to make electrical connections with back plane 1308. As will be seen, edge connectors 1402 and 1406 are for power and ground.

Edge connectors 1404, on the other hand, are for data signals. Edge connectors 1404 make electrical connections with back plane 1308, and as shown in FIG. 14A, conductive traces 1408 electrically connect each of edge connectors 1404 with a base station 1410. It should be apparent that base station 1410 is thus provided with communications channels to and from the tester 1302. That is, communications link 1306, back plane 1308, edge connectors 1404, and traces 1408 provide communications channels between tester 1302 and base station 1410. Test data generated by the tester 1302 to test a die 1436 of wafer 1434 travels from the tester over these channels to the base station 1410, and response data generated by the dies 1436 likewise travels over these channels from the base station to the tester. As discussed above and shown in FIG. 15, the dies 1436a, 1436b, 1436c, 1436d, 1436e, 1436f, and 1436g of wafer 1434 each include a set of four terminals 1438a, 1428b, 1428c, 1428d, 1428e, 1428f, and 1428g. Because the outer two terminals in each set of terminals 1428 are for power and ground, and the inner two terminals are for data input and output, in this example, two channels to the tester are required to test one die-one channel for each data input/output terminal on a die 1436. As shown in FIG. 14A, there are four channels between base station 1410 and tester 1302. Thus, in this simplified example, base station 1410 receives sufficient test data from tester 1302 to test only two dies. As will be seen, however, base station 1410 transmits the test data it receives from the tester 1302 to a plurality of wireless test control chips 1414, which communicate the test data to the dies 1436. In turn, the WTC chips 1414 read response data from the dies 1436 and transmit the response data back to the base station 1410. Thus, by configuring the interface between the base station 1410 and the wireless test control chips, the number of dies actually tested may be different than the number of dies for which test data is received from the tester 1302.

The exemplary test board 1432 shown in FIG. 14A includes seven such wireless test control ("WTC") chips 1414a, 1414b, 1414c, 1414d, 1414e, 1414f, and 1414g. (In this example, there is one WTC chip 1414 for each die 1436 on wafer 1434; a ratio of WTC chips to dies other than one-to-one, however, may be implemented.) Base station 1410 includes a transceiver 1412, and each of the WTC chips 1414 also includes a transceiver 1416. Base station 1410 is thus able to communicate with each of the WTC chips 1414 wirelessly. Vias (not shown) connect each WTC chip 1414a, 1414b, 1414c, 1414d, 1414e, 1414f, and 1414g to a set of contactless communications structures 1458a, 1458b, 1458c, 1458d, 1458e, 1458f, and 1458g on test board 1432 (see FIG. 14B). As will be seen, each set of contactless communications structures 1458 on test board 1432 corresponds to a coupling pads 1550 on a die 1436.

As shown in FIG. 14B, test board 1432 also includes seven sets of conductive probes 1428a, 1428b, 1428c, 1428d, 1428e, 1428f, and 1428g in which each set has two probes. (Probes 1428 may be similar to probes 24 and 26 in FIG. 1. Each set of probes 1428 corresponds to one of the dies 1436 on wafer 1434, and more specifically, each probe in each set corresponds to one of the two outer terminals 1438 of a die 1436, which as discussed above, are the power and ground terminals.

Conductive traces 1422 and 1426 connect each probe in each set to power and ground. That is, the right most (relative to FIG. 14B) probe in each probe set 1428 is connected by trace 1422 to edge connector 1402, which is connected to a power source through back plane 1308. Similarly, the left most (relative to FIG. 14B) probe in each probe set 1428 is connected by trace 1426 to edge connector 1406, which is connected to ground through back plane 1308. The ultimate source of power and ground may be the tester 1302 (which supplies power and ground through communications link 1306) or some other source, including a source internal to test station 1304 or cassette 1410. Voltage regulators, decoupling capacitors, and/or similar circuit elements (not shown) may optionally be included.

As shown in part in FIG. 14C, when the cassette 1310 is assembled, power and ground probes 1428 make physical contact with corresponding power and ground terminals on each die 1436, and a set of contactless communications structures 1458 are in sufficient proximity to coupling pads 1550 on each die to form a an electromagnetic coupling. It should be apparent that the base station 1410 wirelessly interfaces the four channels discussed above between the base station and the tester 1302 with a plurality of WTC chips 1414, each of which provides contactless communications connections through electromagnetic coupling to the data input/output terminals of the dies 1436 being tested. In the example shown, and as discussed above, there are sufficient channels between the tester 1302 and the base station 1410 to test only two dies 1414 at a time. Through the wireless interface between the base station 1410 and the WTC chips 1414, however, seven dies 1436 are tested. The ration of two dies to seven dies is exemplary only and other ratios may be used. Indeed, by simply changing the number of WTC chips 1414 and reconfiguring the wireless interface between the base station 1410 and the WTC chips 1414, the number of dies 1436 actually tested may be changed without changing the number of channel connections to the tester 1302.

The enclosure formed by frame 1418, cover 1435, and device plate 1438 may be sealable, hermetically or otherwise, as needed to meet any applicable clean room standard or other needs. As known in the field, gaskets (not shown) and/or sealing materials (not shown) may be provided with frame 1418, cover 1435, and device plate 1438 to accomplish this. A mechanism (not shown) for holding the frame, cover, and device together may also be included. In addition, the cassette 1310 may optionally include shielding to electrically shield wafer 1434. The cassette 1310 may also optionally include a heating and/or a cooling device (not shown) to control the temperature of the wafer 1434. Cassette 1310 may also include means (not shown) for securing itself to the back plane 1308 or other part of the test station 1304. Test board 1432 and wafer 1434 may include shielding as generally describe above with respect to FIGS. 2A and 2B.

Figure 16:
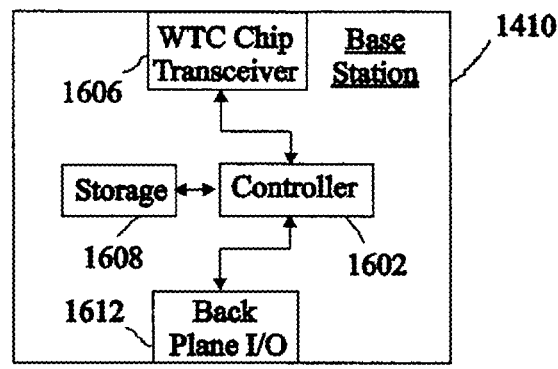
FIG. 16 illustrates a simplified, block diagram of an exemplary base.

FIG. 16 shows a simplified block diagram of an exemplary base station 1410, which may be implemented as an integrated circuit. As shown, base station 1410 includes a controller 1602, data storage 1608, back plane input/output circuitry 1612, and transceiver circuitry 1606. Controller 1602 controls overall operation of the base station 1410. Controller 1602 may comprise a microprocessor operating under software control. Alternatively, controller 1602 may comprise hardwired logic circuits, or controller 1602 may comprise a combination of a microprocessor and hardwired logic circuits. Storage 1608 provides memory for storing data and/or software to be run on controller 1602. Back plane input/output circuitry 1612 provides for input of signals from and output of signals to conductive traces 1408, which as discussed above, are connected to edge connectors 1404, which are connected to back plane 1308. The transceiver circuitry 1606 provides for output of signals to transceiver 1412 that are to be wirelessly transmitted to one or more WTC chips 1414 and input of signals received by transceiver 1412 from a WTC chip.

Figure 17:
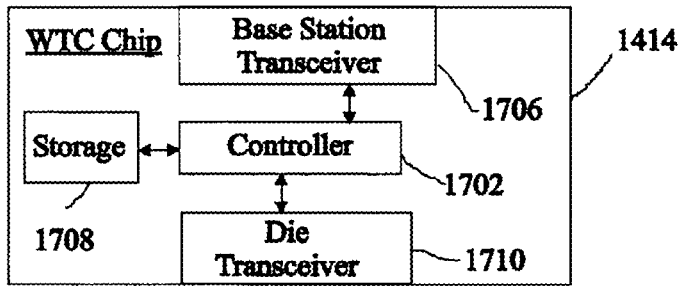
FIG. 17 illustrates a simplified, block diagram of an exemplary wireless transmission control chip.

FIG. 17 shows a simplified block diagram of an exemplary WTC chip 1414, which may be implemented as an integrated circuit. As shown WTC chip 1414 includes a controller 1702, data storage 1708, die transceiver circuitry 1710, and base station transceiver circuitry 1706. Controller 1702 controls overall operation of the WTC chip 1414. Like controller 1602, controller 1702 may comprise a microprocessor operating under software control, hardwired logic, or a combination of a microprocessor and hardwired logic. Storage 1708 provides memory for storing data and/or software to be run on controller 1702. Die transceiver circuitry 1710 provides for output of signals to and input of signals from contactless communications structures 1458. The base station transceiver circuitry 1706 provides for output of signals to transceiver 1416 that are to be transmitted to the base station 1410 and input of signals received by transceiver 1416 from the base station 1410.

Figure 18:
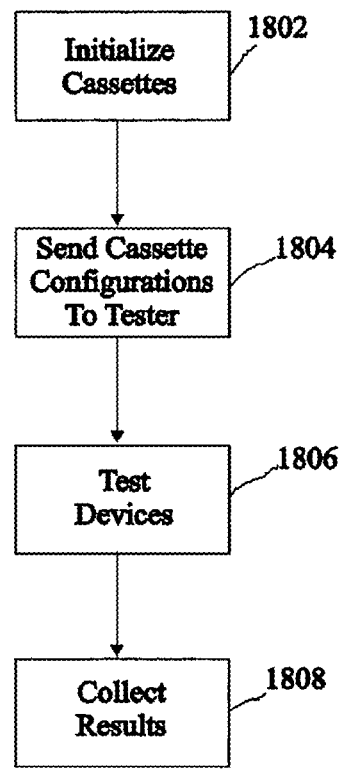
FIG. 18 illustrates exemplary operation of the test system of FIG. 13.

FIG. 18 illustrates exemplary operation of the test system 1300 shown in FIG. 13. At step 1802, the cassettes 1310 and 1312 are initialized, which may include such things as each WTC chip 1414 in a cassette transmitting an identifier to the base station 1410 in the cassette, and establishing a timing protocol for communications by a WTC chip to the base station. For example, time division or frequency division multiplexing may be established for communications from multiple WTC chips 1414 to the base station 1410 on a cassette. As another example, communications by a particular WTC chip 1414 may be allowed only in response to polling by the base station 1410. A cassette 1310 may have multiple base stations 1410, and if so, initialization may include assigning each WTC chip 1414 in the cassette to a particular base station 1410 to achieve, for example, balanced data through put. If there are multiple base stations, each base station 1410 may communicate with its assigned WTC chips 1414 on a different frequency, or transmission from each base station 1410 may include a code identifying the base station so that even though all of the WTC chips 1414 receive transmissions from a particular base station, the WTC chips 1414 respond only to their assigned base station.

At step 1804, the base stations 1410 in each cassette 1310 and 1312 send information to the tester 1302 describing the configuration of each cassette. The dies 1436 of the wafers 1434 in the cassettes 1310 and 1312 are then tested at step 1806, and results of the testing are collected at step 1808. It should be noted that the step of collecting results 1808 may begin before testing 1806 has completed, and thus, steps 1806 and 1808 may operate, at least in part, concurrently.

Figure 19:
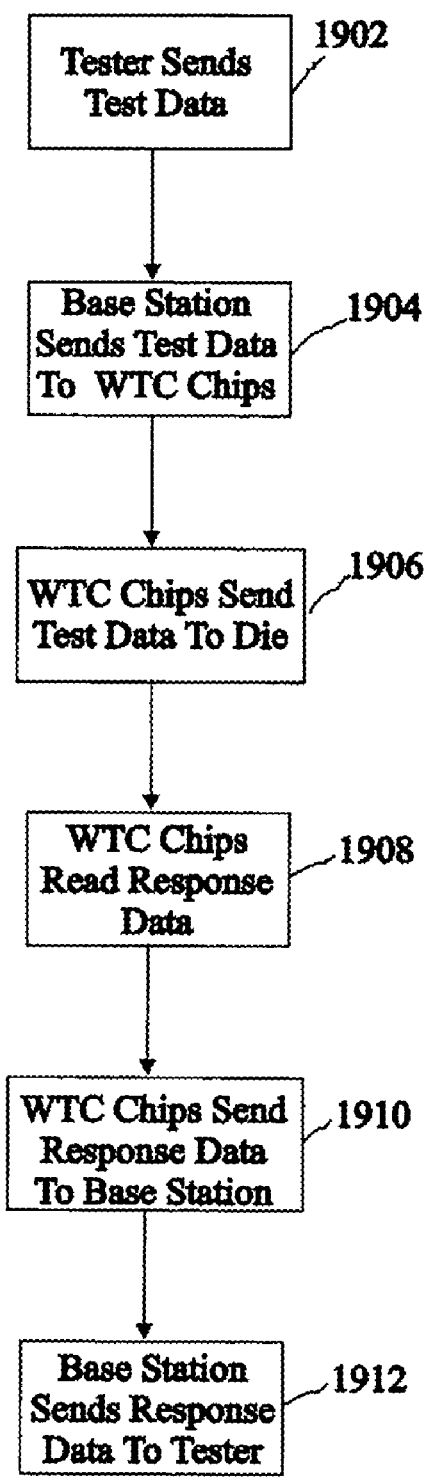
FIG. 19 illustrates exemplary operation of steps 1806 and 1808 of FIG. 18.

An exemplary implementation of steps 1806 and 1808 is shown in FIG. 19. At step 1902, tester 1302 sends test data for two dies over communications link 1306 to the back plane 1308 of test station 1304. At step 1904, the base station 1410 in each cassette 1310 and 1312 receives the test data and wirelessly broadcasts test data to each of the seven WTC chips 1414a, 1414b, 1414c, 1414d, 1414e, 1414f, and 1414g on its cassette. In this example, as discussed above, each base station 1410 receives sufficient test data to test two dies 1436 (that is, the base station receives two sets of test data, each set sufficient to test one die), yet there are seven WTC chips 1414. If the test data for each die is the same, which is likely because the dies on the wafer would typically be the same, the base station 1410 has received identical sets of test data and may simply ignore one set of test data and transmit the other set of test data to all seven of the WTC chips 1414. Alternatively, the base station 1410 may transmit one set of test data to a first set of the WTC chips (e.g., 1414a, 1414b, 1414c, and 1414d) and transmit the other set of test data to a second set of the WTC chips (e.g., 1414e, 1414f, and 1414g). The base station 1410 may transmit selectively only to one or a subset of the seven WTC chips 1414 in any of a number of ways. For example, the base station 1410 may transmit to one set of WTC chips 1414 on one frequency and transmit to another set of WTC chips on a different frequency. As another example, the base station 1410 may include in its transmission a code identifying the intended recipients of the transmission.

The test data may be test vectors that are simply to be passed through to the WTC chips 1414 without significant modification. Alternatively, the base station 1410 may modify the test data, or the test data received from the tester 1302 may be commands that cause the base station 1410 to generate other commands or test vectors that are broadcast as test data to the WTC chips 1414. At step 1906, each WTC chip 1414 contactlessly transmits through electromagnetic coupling of contactless communications structures 1458 with coupling pads 1550 the test data it received from the base station 1410 at step 1904 to its corresponding die 1436. The test data passed from a WTC chip 1414 to its corresponding die 1436 may be the same as the test data received by the WTC chip 1414 from the base station 1410. Alternatively, the WTC chip 1414 may modify the test data, or the test data received from the base station 1410 may be a command or commands that cause the WTC chip 1414 to generate other commands or test vectors that are sent as test data to the corresponding die 1436. The test data received by a die may be test vectors that are simply written into each die 1436. Alternatively, the test data received by a die 1436 may include test commands that cause built-in-self-test (BIST) circuitry (not shown) on the die 1436 to execute self tests as is known in the field. Other types of test data may also be used.

At step 1908, a WTC chip 214 reads response data generated by its die 1436 in response to the test data. The WTC chip 1414 reads the responds data from a die 1436 contactlessly through electromagnetic coupling of contactless communications structures 1458 with coupling pads 1550. At step 1910, the WTC chip 1414 sends the response data wirelessly via its transceiver 1416 to the transceiver 1412 of the base station 1410. At step 1912, the base station 1410 sends the response data to the tester 1302 via traces 1408, edge connectors 1404, back plane 1308, and communications link 1306.

The response data is preferably sent to the tester 1302 with an identifier identifying the die 1436 that produced the response data. Data compression or any of a variety of transmission techniques may optionally be used.

It should be apparent that there are a variety of ways to implement steps 1908, 1910, and 1912. For example, response data may be buffered at a WTC chip 1414 until testing of its corresponding die 1436 is complete, after which the WTC chip signals its base station 1410 and then wirelessly transmits all of the response data generated by the die. As another example, response data may be buffered at a base station 1410 until testing of all of the dies 1436 in the cassette is completed, after which the base station sends all of the response data to the tester 1302. Other variations are possible.

Figure 20:
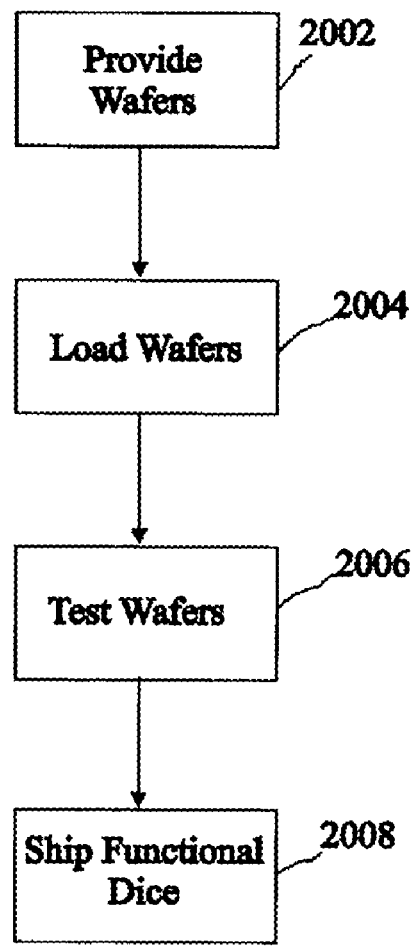
FIG. 20 illustrates exemplary manufacture of semiconductor dies.

FIG. 20 illustrates an exemplary process for making semiconductor dies. At step 2002, manufactured wafers with one or more dies are provided. At step 2004, the wafer is loaded into a test system, such as the test system shown in FIG. 1 or FIG. 13. At step 2006, the dies of the wafer are tested using any of processes described above. At step 2008, functional dies are shipped to customers.

Figure 21:
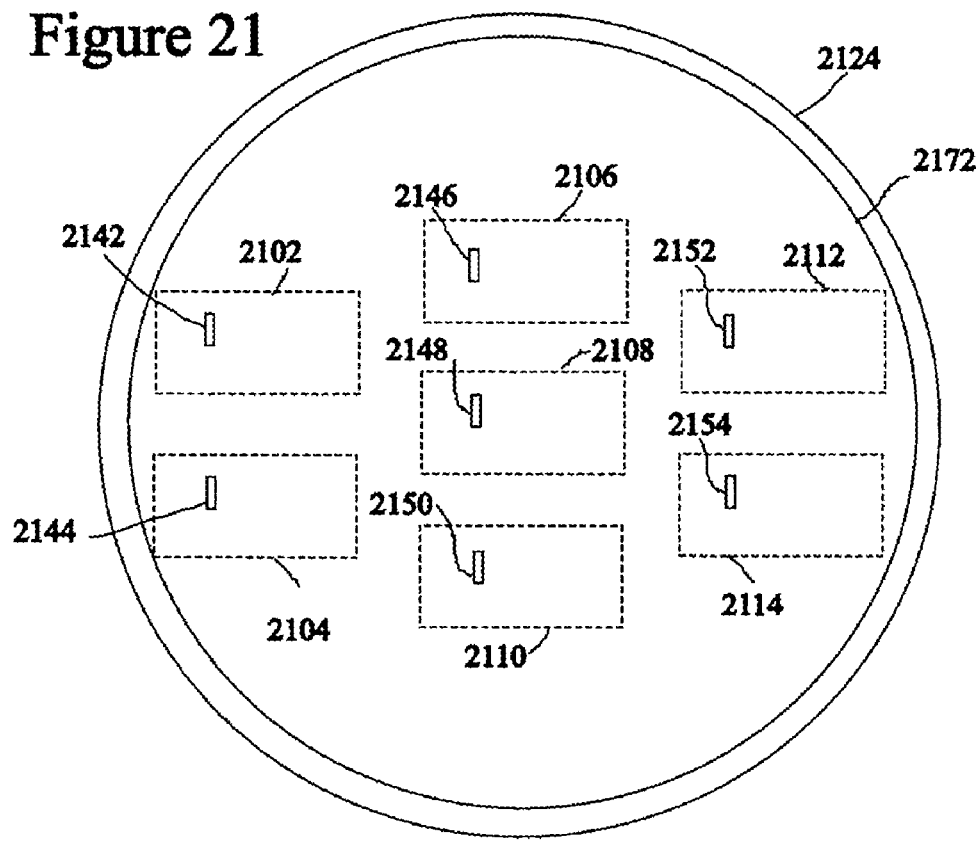
FIG. 21 illustrates an exemplary semiconductor wafer.
Figure 22:
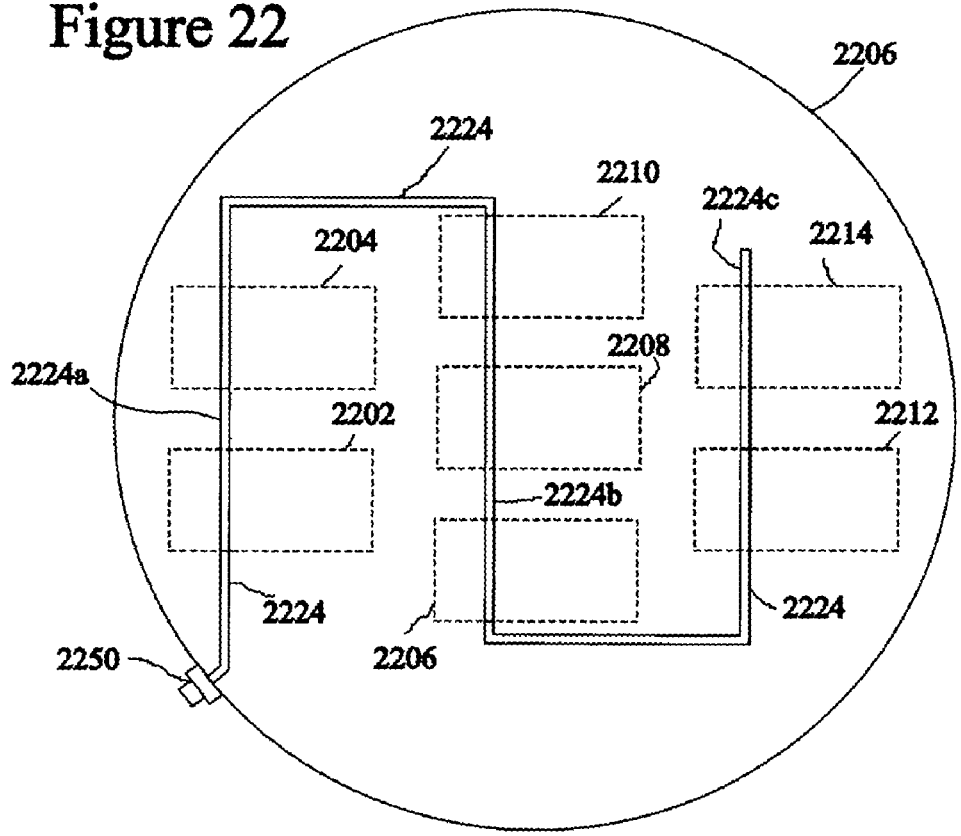
FIG. 22 illustrates an exemplary probe card.

FIGS. 21 and 22 illustrate still another exemplary embodiment. FIG. 21 illustrates a wafer 2124 with seven dies 2102, 2104, 2106, 2108, 2110, 2112, and 2114 (shown in dashed lines). A dielectric or insulating material 2172 is disposed over wafer 2124, and a power distribution plane (not shown) and a ground distribution plane (not shown) are embedded within insulating material 2172. The power distribution plane (not shown) and the ground distribution plane (not shown) may be disposed within layers of insulating materials 2172 as shown in FIGS. 2A and 2B, and the power distribution plane and ground plane may be configured to provide power and ground connections to dies 2102, 2104, 2106, 2108, 2110, 2112, and 2114. Power and ground connections (not shown) may be provided for the power distribution plane (not shown) and the ground distribution plane (not shown) embedded in insulating material 2172 in any way, including through probes (not shown) on interface board 2206, as described above. Each die 2102, 2104, 2106, 2108, 2110, 2112, and 2114 on wafer 2124 includes only one coupling pad (not shown), which is "visible" for electromagnetic coupling through windows 2142, 2144, 2146, 2148, 2150, 21502, and 2154 in insulating layer 2172 and the embedded power and ground planes. Each die 2102, 2104, 2106, 2108, 2110, 2112, and 2114 may also include communications control circuitry (not shown) similar to 22 in FIG. 5.

FIG. 22 illustrates a probe card 2206 that includes an electrical connector 2250 (e.g., a connector for a coaxial cable) that is connected to a single coupling trace 2224. Coupling trace 2224 is arranged on probe card 2206 to correspond to windows 2142, 2144, 2146, 2148, 2150, 2152, and 2154 on wafer 2124. Thus, while probe card 2206 and wafer 2124 are brought into proximity and properly aligned, coupling trace 2224 forms electromagnetic couplings through windows 2142, 2144, 2146, 2148, 2150, 2152, and 2154 with the coupling pad (not shown) on each of dies 2102, 2104, 2106, 2108, 2110, 2112, and 2114. Coupling trace 2224 may be terminated in its characteristic impedance. Note that, in this example, the functions of a communications control chip (e.g., 318, 320, or 320) are performed by a tester or other electronic device (not shown) whose input and output is connected to connector 2250. Alternatively, a communications control chip similar to, for example, chip 318 may be disposed on probe card 2206. It should be apparent that data on coupling trace 2224 (and therefore data transmitted between coupling trace 2224 and the coupling pad (not shown) on any of the dies 2102, 2104, 2106, 2108, 2110, 2112, and 2114) is in serial form. The communications control chip (not shown), whether located on or off of the probe card 2206, and the communications control circuitry (not shown) on each die 2102, 2104, 2106, 2108, 2110, 2112, and 2114 are configured to transmit and receive data in serial streams.

Figure 23:
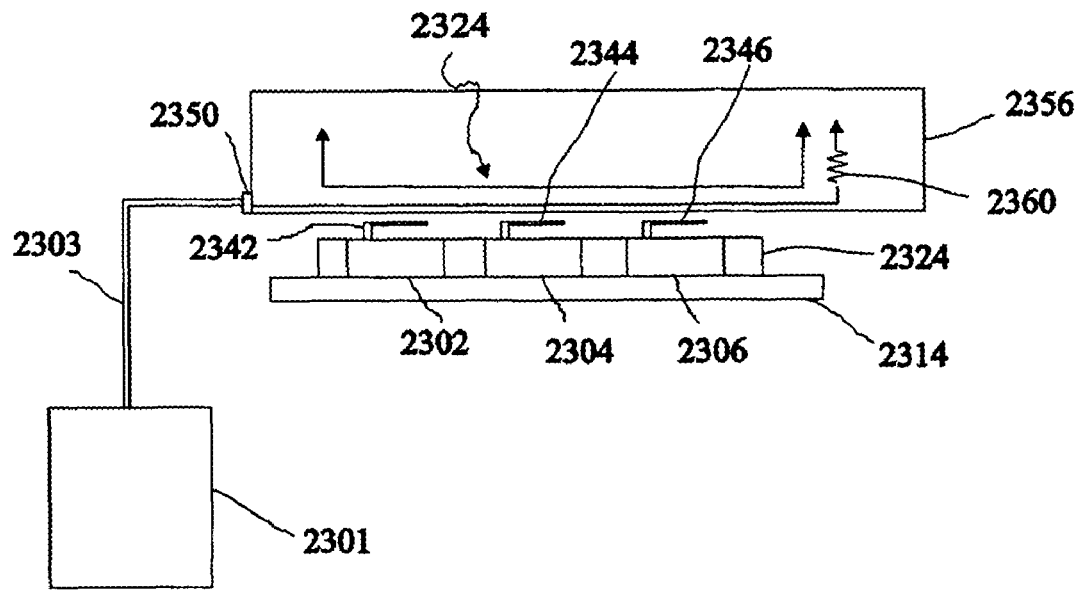
FIG. 23 illustrates a schematic diagram of an exemplary test system.

FIG. 23 illustrates a schematic diagram of a test system in which a tester 2301 is connected via communications link 2303 and electrical connector 2350 (e.g., a coaxial cable, twisted pair, optical channel, wireless channel, etc.) to a coupling trace 2324 (shown schematically in FIG. 23). Communications control circuitry (not shown) similar to communications control circuitry 20 in FIG. 1 for controlling communications through coupling trace 2324 (e.g., driving signals onto trace 2324 and sensing signals generated on coupling trace 2324 by signals on one of coupling pads 2342, 2344, or 2346) may be included in tester 2301 or located on test board 2356. As shown in FIG. 23, a support 2314 holds DUTs 2302, 2304, and 2306 (of course there may be more or fewer DUTs), which may be, for example, dies of an unsingulated semiconductor wafer 2324, singulated dies, or other electronic devices to be tested. Each DUT 2302, 2304, and 2306 includes a coupling pad or loop 2342, 2344, and 2346, respectively. Each DUT also includes communications control circuitry (not shown) similar to communications control circuitry 22 in FIG. 1 for controlling communications through coupling pad or loop 2342, 2344, and 2346 to and from coupling trace 2324. As described above, data signals may be communicated contactlessly between coupling trace 2324 and each of coupling pads 2342, 2344, and 2346. As shown in FIG. 23, coupling trace 2324 may be terminated with a resistance 2360 approximately equal to the characteristic impedance of the coupling trace 2324. Power and ground connections may be provided by probes (not shown) as generally described above (e.g., power and ground probes 26 and 24 in FIG. 1).

Figure 24:
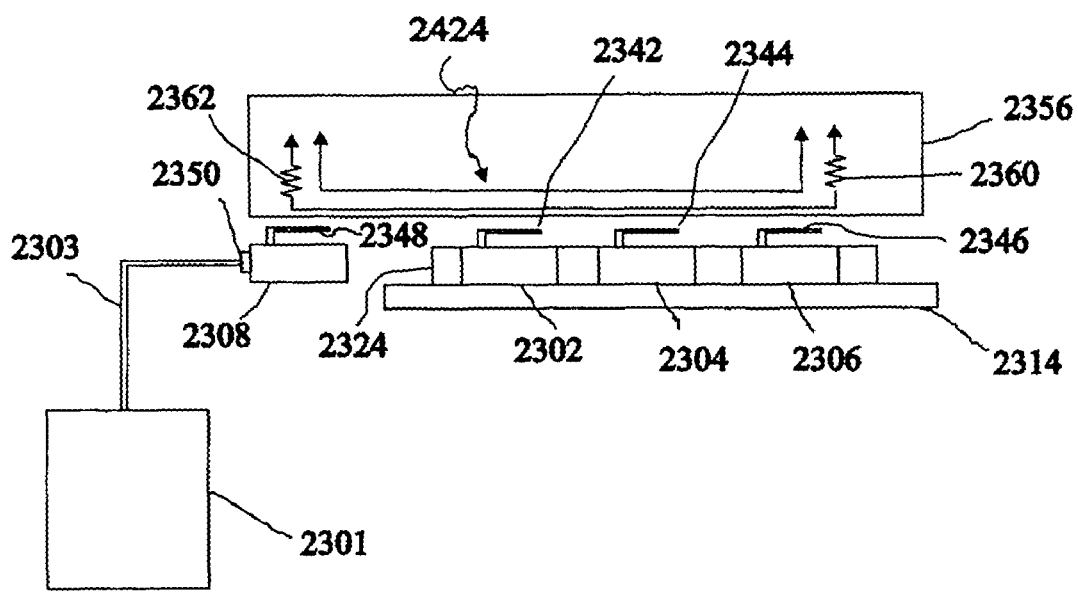
FIG. 24 illustrates a schematic diagram of another exemplary test system.

FIG. 24 illustrates a variation of the system shown in FIG. 23. In FIG. 24, the communications link 2303 is between the tester 2301 and a communications control chip 2308, which is secured to test board 2356 by any suitable means (not shown). Communications control circuitry chip 2308 includes circuitry similar to communications control circuitry 20 in FIG. 1 for controlling contactless communications between coupling pad 2348 and coupling trace 2424 (e.g., driving signals onto coupling pad 2348 and sensing signals generated in coupling trace 2424 by signals on one of coupling pads 2342, 2344, or 2346). DUTs 2302, 2304, and 2306 are as described above with respect to FIG. 23. That is, each DUT 2302, 2304, and 2306 includes communications control circuitry (not shown) for controlling contactless communications of signals between coupling pads 2342, 2344, and 2346, on one hand, and coupling trace 2424, on the other hand. Coupling trace 2424, which may be terminated at both ends with resistances 2360 and 2362 approximately equal to the characteristic impedance of coupling trace 2424, is passive. Test data signals are communicated from tester 2301 to DUTs 2302, 2304, and 2306 as follows: the data signals are communicated from tester 2301 over communications link 2303 to communications control chip 2308, which encodes the test data (as described above) and drives the encoded data onto coupling pad 2348. Because coupling pad 2348 and coupling trace 2424 are electromagnetically coupled, the encoded signal driven onto coupling pad 2348 induces a similar signal in coupling trace 2424, which in turn generates similar signals in coupling pads 2342, 2344, and 2346 on each of DUTs 2302, 2304, and 2306. (Each of coupling pads 2342, 2344, and 2346 are also electromagnetically coupled to coupling trace 2424.) The communications control circuitry (not shown) in each of DUTs 2302, 2304, and 2306 detects and decodes the signals induced in each of coupling pads 2342, 2344, and 2346.

Communication of test data from a DUT 2302, 2304, or 2306 is similar but in reverse order. That is, communications control circuitry (not shown) in one of DUTs 2302, 2304, or 2306 encodes the test data (as described above) and drives the encoded data onto its coupling pad (one of 2342, 2344, or 2346), which induces a similar signal on coupling trace 2424. The induced signal on coupling trace 2424 induces a similar signal in coupling pad 2348, which is detected and decoded by communications control chip 2308 and then sent to tester 2301 via communications link 2303. Of course provisions may be made for an orderly transmission of data from DUTs 2302, 2304, and 2306 to communications control chip 2308. For example, communications control chip 2308 may poll DUTs 2302, 2304, and 2306, each of which transmits only if polled. As another nonexclusive example, any networking protocol or modification of a networking protocol may be used (e.g., an Ethernet protocol). Data transmitted from communications control chip 2308 through coupling trace 2424 to DUTs 2302, 2304, and 2306 may be destined for all of the DUTs or may include a code indicating less than all of the DUTs as the intended recipient or recipients. Data transmitted from a DUT 2302, 2304, or 2306 to the communications control chip 2308 my include a code identifying the transmitting DUT.

Although specific embodiments and applications of the invention have been described in this specification, there is no intention that the invention be limited these exemplary embodiments and applications or to the manner in which the exemplary embodiments and applications operate or are described herein. For example, although one WTC chip is shown in the above examples for every one die under test, one WTC chip may correspond to two or more dies under test or more than one WTC chip may correspond to one die under test. As another example, the pogo pads 312, 314, and 316 shown in FIGS. 3A, 3B, 4A, and 4B may be replaced with other types of electrical connectors, including without limitation zero insertion force connectors or even contactless electromagnetically coupled structures. As yet another example, although the above-described examples show all data being communicated contactlessly between an interface board or probe card, on one hand, and a DUT or wafer, on the other hand, some data signals could be communicated using traditional contact connections, while other data signals are communicated contactlessly as described above. As still another example, coupling traces could be placed on the wafer and coupling pads on the interface board or probe card.

In addition, it should be apparent that all of the processes illustrates in FIGS. 9A, 9B, 18, 19, and 20 are exemplary and simplified. Provisions for repeating the process, error processing, exit from the process, and other similar functions may be added and are well within the skill of the ordinary practitioner and need not be discussed herein.

The invention claimed is:

1. An interface apparatus comprising:
   a substrate;
   tester communicating means for communicating with a tester, said tester communicating means disposed on said substrate;
   contactless communications means for communicating a test signal from said tester communicating means to a terminal of a device under test without physically contacting said terminal, said contactless communications means comprising a coupling trace disposed to be placed in proximity to said terminal of said device under test and electromagnetically couple with said terminal, wherein said test signal on said coupling trace generates a similar test signal on said terminal.

2. The apparatus of claim 1, wherein said contactless communications means communicates a plurality of test signals with a plurality of terminals of said device under test without physically contacting said terminals.

3. The apparatus of claim 2, wherein said contactless communications means comprises a plurality of conductive traces.

4. The apparatus of claim 3, wherein each of said traces is electromagnetically coupleable to conductive structures on said device under test.

5. The apparatus of claim 1 further comprising means for providing power to said device under test.

6. The interface apparatus of claim 5, wherein said means for providing power to said device under test comprises a probe positioned to contact a power terminal of said device under test.

7. The apparatus of claim 1 further comprising means for controlling contactless communications with said device under test.

8. The interface apparatus of claim 1, wherein said substrate is rigid.

9. The interface apparatus of claim 8, further comprising:
   a probe disposed on said rigid substrate and positioned on said substrate to allow said probe to physically contact a second terminal of said device under test.

10. An interface apparatus comprising:
    electrically conductive elements connectable to a tester;
    electrically conductive structures disposed to be electromagnetically coupled with electrical conductors of a device under test without physically contacting said conductors, wherein a test signal on one of said conductive structures generates a similar test signal on one of said conductors with which said one of said conductive structures is electromagnetically coupled; and
    a substrate, wherein said electrically conductive structures are disposed on said substrate to correspond to said conductors on said device under test.

11. The apparatus of claim 10, wherein said conductive structures are electromagnetically coupleable to a terminated transmission line of said device under test.

12. The apparatus of claim 10 further comprising at least one probe disposed to provide power to said device under test.

13. The apparatus of claim 10 further comprising circuitry configured to control communications with said device under test.

14. The apparatus of claim 10, wherein said electrically conductive structures are disposed to communicate contactlessly a single test signal received from said tester to a plurality of devices under test.

* * * * *